(12) United States Patent
Mohammed et al.

(10) Patent No.: US 8,988,895 B2
(45) Date of Patent: Mar. 24, 2015

(54) INTERCONNECTION ELEMENTS WITH ENCASED INTERCONNECTS

(75) Inventors: Ilyas Mohammed, Santa Clara, CA (US); Belgacem Haba, Saratoga, CA (US)

(73) Assignee: Tessera, Inc., San Jose, CA (US)

( * ) Notice: Subject to any disclaimer, the term of this patent is extended or adjusted under 35 U.S.C. 154(b) by 203 days.

(21) Appl. No.: 13/215,725

(22) Filed: Aug. 23, 2011

(65) Prior Publication Data
US 2013/0050972 A1 Feb. 28, 2013

(51) Int. Cl.
| | |
|---|---|
| H05K 7/04 | (2006.01) |
| H01B 7/00 | (2006.01) |
| H01R 43/00 | (2006.01) |
| H01L 21/50 | (2006.01) |
| H05K 3/46 | (2006.01) |
| H01L 23/498 | (2006.01) |
| H01L 21/48 | (2006.01) |
| H01R 12/52 | (2011.01) |

(52) U.S. Cl.
CPC ........ *H05K 3/4602* (2013.01); *H01L 23/49827* (2013.01); *H01L 21/486* (2013.01); *H01R 12/523* (2013.01); *H05K 2201/10378* (2013.01); *H05K 2203/0235* (2013.01); *H01L 2224/16225* (2013.01); *H01L 2924/15311* (2013.01); *H01L 23/49838* (2013.01)
USPC .............. 361/803; 174/264; 174/266; 439/91

(58) Field of Classification Search
CPC ............ H05K 2203/0235; H05K 2201/10378
USPC ......... 174/119 R, 264, 266; 361/803; 439/91; 29/858
See application file for complete search history.

(56) References Cited

U.S. PATENT DOCUMENTS

| | | | | |
|---|---|---|---|---|
| 5,509,815 A | * | 4/1996 | Jin et al. ........................ | 439/91 |
| 5,753,380 A | * | 5/1998 | Takahashi et al. ............ | 428/651 |
| 5,867,369 A | * | 2/1999 | Antonuccio et al. .......... | 361/796 |
| 5,972,788 A | * | 10/1999 | Ryan et al. .................... | 438/634 |
| 6,989,575 B2 | * | 1/2006 | Gates et al. ................... | 257/421 |
| 7,049,208 B2 | * | 5/2006 | Muthukumar et al. ....... | 438/459 |
| 7,239,014 B2 | * | 7/2007 | Ogawa et al. ................. | 257/700 |
| 7,579,553 B2 | * | 8/2009 | Moriizumi .................... | 174/260 |
| 7,759,782 B2 | | 7/2010 | Haba et al. | |
| 2002/0195265 A1 | * | 12/2002 | Miller et al. ................ | 174/70 R |
| 2003/0110622 A1 | * | 6/2003 | Nose ............................. | 29/832 |
| 2005/0093148 A1 | * | 5/2005 | Hanke et al. ................. | 257/737 |
| 2010/0273293 A1 | | 10/2010 | Haba et al. | |
| 2011/0200841 A1 | * | 8/2011 | Wisotzki ....................... | 428/637 |
| 2012/0241208 A1 | * | 9/2012 | Petersen ....................... | 174/266 |

* cited by examiner

*Primary Examiner* — Anatoly Vortman
*Assistant Examiner* — Jacob Crum
(74) *Attorney, Agent, or Firm* — Lerner, David, Littenberg, Krumholz & Mentlik, LLP

(57) ABSTRACT

An interconnection element is disclosed that includes a plurality of drawn metal conductors, a dielectric layer, and opposed surfaces having a plurality of wettable contacts thereon. The conductors may include grains having lengths oriented in a direction between the first and second ends of the conductors. A dielectric layer for insulating the conductors may have first and second opposed surfaces and a thickness less than 1 millimeter between the first and second surface. One or more conductors may be configured to carry a signal to or from a microelectronic element. First and second wettable contacts may be used to bond the interconnection element to at least one of a microelectronic element and a circuit panel. The wettable contacts may match a spatial distribution of element contacts at a face of a microelectronic element or of circuit contacts exposed at a face of component other than the microelectronic element.

23 Claims, 27 Drawing Sheets

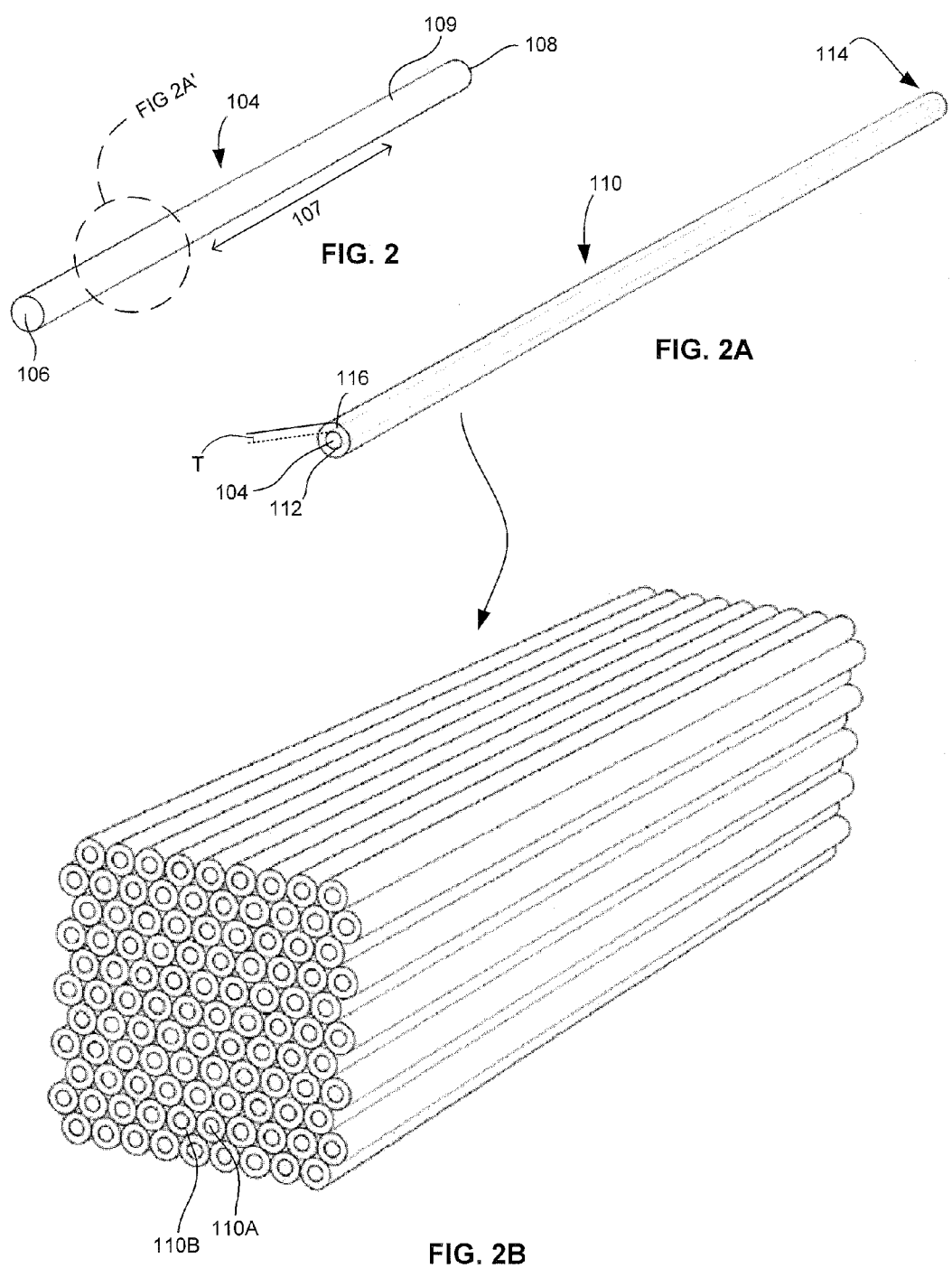

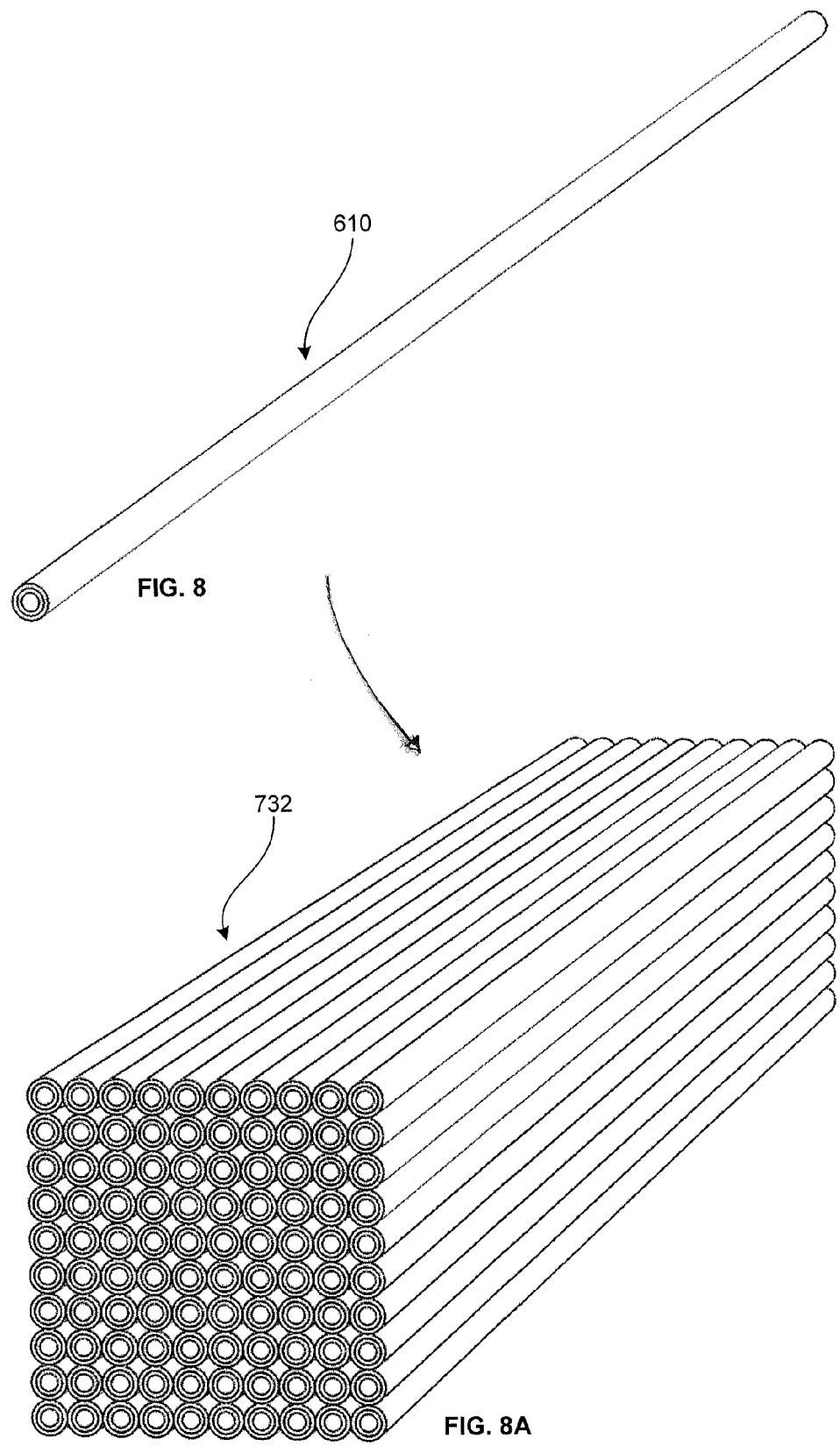

INTERCONNECTION ELEMENTS WITH ENCASED INTERCONNECTS

BACKGROUND OF THE INVENTION

Interconnection elements or components, such as interposers, are used in electronic assemblies to facilitate connection between components with different connection configurations or to provide needed spacing between components in a microelectronic assembly. Some interposers may be used as components of microelectronic assemblies. These microelectronic assemblies generally include one or more packaged microelectronic elements such as one or more semiconductor chips mounted on a substrate. The conductive elements of the interposer can include the conductive traces and terminals that can be used for making electrical connection with a larger substrate or circuit panel in the form of a printed circuit board ("PCB") or the like. This arrangement facilitates electrical connections needed to achieve desired functionality of the devices. The chip can be electrically connected to the traces and hence to the terminals, so that the package can be mounted to a larger circuit panel by bonding the terminals of the circuit panel to contact pads on the interposer.

Despite considerable efforts devoted in the art heretofore to development of interposers and methods for fabricating such components, further improvement is desirable.

BRIEF SUMMARY OF THE INVENTION

In a first aspect of the invention, there is an interconnection element that includes metal conductors and a dielectric layer surrounding and insulating the conductors. The conductors may be a plurality of drawn metal conductors that each have a structure in which the grains therein have lengths oriented in a direction between the first and second ends of the metal conductor. The dielectric layer may have first and second opposed surfaces, as well as a thickness less than 1 millimeter between the first and second surfaces. The first and second ends of each conductor are not covered by the dielectric layer at the first and second surfaces. At least one of the conductors may be configured for carrying a signal to or from a microelectronic element. The interconnection element may have first and second pluralities of wettable contacts adjacent the first and second opposed surfaces, respectively. The first and second wettable contacts may be usable to bond the interconnection element to at least one of a microelectronic element and a circuit panel. At least one of the first wettable contacts or the second wettable contacts may match a spatial distribution of element contacts at a face of the microelectronic element and at least one of the first wettable contacts or the second wettable contacts may match a spatial distribution of circuit contacts exposed at a face of a component other than the microelectronic element.

In another aspect of the present invention, an interconnection component includes a plurality of drawn metal conductors, a common metal region surrounding individual ones of the conductors, and a dielectric separating the individual ones of the conductors from the common metal region. The plurality of drawn metal conductors may each have a structure in which grains therein have lengths oriented in a direction between first and second ends thereof. The common metal region may be configured to carry a common electric potential. The dielectric may have first and second opposed surfaces and a thickness less than 0.5 millimeters between the first and second surfaces. The first and second ends of each conductor may not be covered by the dielectric layer at the first and second surfaces. The interconnection component may have first and second pluralities of wettable contacts adjacent the first and second opposed surfaces, respectively. The first and second wettable contacts may be usable to bond the interconnection component to at least one of a microelectronic element and a circuit panel. At least one of the first wettable contacts or the second wettable contacts may match a spatial distribution of element contacts at a face of a microelectronic element or may match a spatial distribution of circuit contacts at a face of a circuit panel.

In one embodiment in accordance with the first or second aspect, a tolerance for a cross-sectional width of the metal conductors is 1 micron for a 50 micron width or diameter.

In another embodiment, in accordance with the first or second aspect, a surface roughness of the metal conductor is less than 1 micron.

In still another embodiment, in accordance with the first or second aspect, the metal conductor is comprised of a metal alloy. The thickness of the metal conductor may be less than 0.5 millimeters or less than 100 microns.

In another embodiment, in accordance with the first or second aspect, the conductors may have an annular shape and each conductor may surround a dielectric core. Instead of a dielectric core, the conductor may instead be hollow, and include air or gas.

In another embodiment, in accordance with the first or second aspect, the first wettable contacts define a first pitch and the second wettable contact define a second pitch that is different from the first pitch.

In another embodiment, in accordance with the first or second aspect, a system comprises a microelectronic package and one or more other electronic components. The microelectronic package is comprised of the interconnection element and second wettable contacts bonded to the microelectronic element. One or more other electronic components are electrically connected with the package. Alternatively, the system further comprises a housing, and the package and the one or more other electronic components is mounted to the housing.

In a third aspect of the presently disclosed embodiment, there is a method for manufacturing at least one interconnection component that comprises arranging a plurality of individual insulated elongated metal conductors in parallel in an array, treating the conductors to form a unitary body and severing the unitary body. The conductors may have widths less than 100 microns. During the step of treating, the dielectric material forms a unitary body in which the positions of the conductors are fixed. During the severing step, the unitary body may be severed in a direction transverse to the lengths of the conductors to form at least one interconnection component having severed portions of the conductors exposed at first and second opposed surfaces, such that the thickness between the first and second surfaces is less than 0.5 millimeters. The conductors will be insulated from one another.

In another embodiment, the elongated metal conductors are extruded conductors.

In another embodiment, a maximum distance between any two adjacent conductors is less than 0.5 millimeters.

In still another embodiment, dielectric material insulating respective conductors extends between opposed ends of the respective conductors.

In yet another embodiment, the step of arranging includes filling each position of the array with an individually insulated metal conductor.

In another embodiment, the step of arranging includes arranging a plurality of individual elongated metal conductors at at least some positions of the array. This provides at least a first spacing between some of the metal conductors and a second spacing between others of the metal conductors.

In another embodiment, the at least one component has first and second pluralities of wettable contacts adjacent the first and second opposed surfaces, respectively. The first and second wettable contacts may bond the interconnection component to at least one of a microelectronic element or a circuit panel. At least one of the first wettable contacts or the second wettable contacts may be configured for bonding to element contacts on a face of a microelectronic element and at least one of the first wettable contacts or the second wettable contacts may be configured for bonding to circuit contacts on a face of a circuit panel.

In another alternative embodiment, the wettable contacts are defined by first exposed end surfaces or opposed second exposed end surfaces of the metal conductors embedded within the at least one component.

In still another embodiment, the method further includes forming conductive elements, including at least some of the second wettable contacts in electrical connection with the second end surfaces.

In another aspect of the presently disclosed embodiments, a method for making a microelectronic assembly includes mounting an interconnection component made according to the first or second aspects of the embodiments discussed above to a substrate having a plurality of first contacts thereon. The at least some of the first wettable contacts may be electrically connected with the first contacts. The method further includes mounting a microelectronic element that has a plurality of second contacts exposed at a face thereof to the interconnection component. At least some of the second contacts are electrically connected with the second wettable contacts of the interconnection component.

In alternative embodiment of this aspect, the step of mounting the microelectronic element includes joining the second contacts with the second wettable contacts through masses of conductive bonding material.

In another embodiment, the step of mounting the at least one interconnection component with the substrate includes joining the first contacts with the first wettable contacts through masses of conductive bonding material.

In another embodiment, the plurality of conductors are formed from at least one of the group consisting of: gold, copper, copper alloy, aluminum, and nickel.

In accordance with another aspect of the presently disclosed embodiments, a method for manufacturing at least one interconnection component includes the steps of arranging a plurality of individual elongated metal conductors and elongated individual dielectric elements in parallel in an array; heating the array to cause the dielectric material to form a unitary body in which the positions of the metal conductors are fixed; and severing the unitary body in a direction transverse to the lengths of the metal conductors to form at least one component having severed portions of the metal conductors arranged in the array and insulated from one another. The dielectric elements may separates at least some of the conductors from one another.

In accordance with another aspect of the presently disclosed embodiments, a method for manufacturing at least one interconnection component includes the steps of successively: a) arranging a plurality of lengths of first conductors in parallel along surfaces of a core member; b) forming a dielectric layer that has substantially planar surfaces and separating the lengths from one another; c) arranging a plurality of lengths of additional conductors in parallel along the surfaces of the dielectric layer; d) forming an additional dielectric layer separating the lengths of the additional conductors from one another, such that the additional dielectric layer has substantially planar surfaces; e) repeating steps c) and d) one or more times to form a plurality of the additional dielectric layers each of which separates additional conductors therein from one another; and f) severing the unitary body in a direction transverse to the lengths of the first and additional conductors to form at least one component having severed portions of the conductors arranged in an array and insulated from one another.

In accordance with another aspect of the presently disclosed embodiments, a method for manufacturing at least one interconnection component includes the steps of threading a plurality of lengths of metal conductors in a parallel serpentine paths around a plurality of members defining respective turning locations in the paths; forming a unitary body having dielectric material insulating the metal conductors from one another and insulating respective path segments of each metal conductor from one another; and severing the unitary body in a direction transverse to the lengths of the path segments to form at least one component having severed portions of the metal conductors arranged in an array and insulated from one another.

In an alternative embodiment, the at least one component has first and second opposed surfaces and each severed portion is uncovered by the dielectric material of the body at the first and second surfaces.

BRIEF DESCRIPTION OF THE DRAWINGS

FIG. 1 is a perspective view of an interconnection element in accordance with one embodiment.

FIGS. 8, 8A, 8B, and 8C illustrate an alternative method of making an alternative interconnection element in accordance with one embodiment.

FIGS. 10, 10A, 10B, 10B-1, 10B-2, 10C, 10D, 10E and 10F illustrate an alternative method of making an alternative interconnection element.

DETAILED DESCRIPTION

Figure 10:
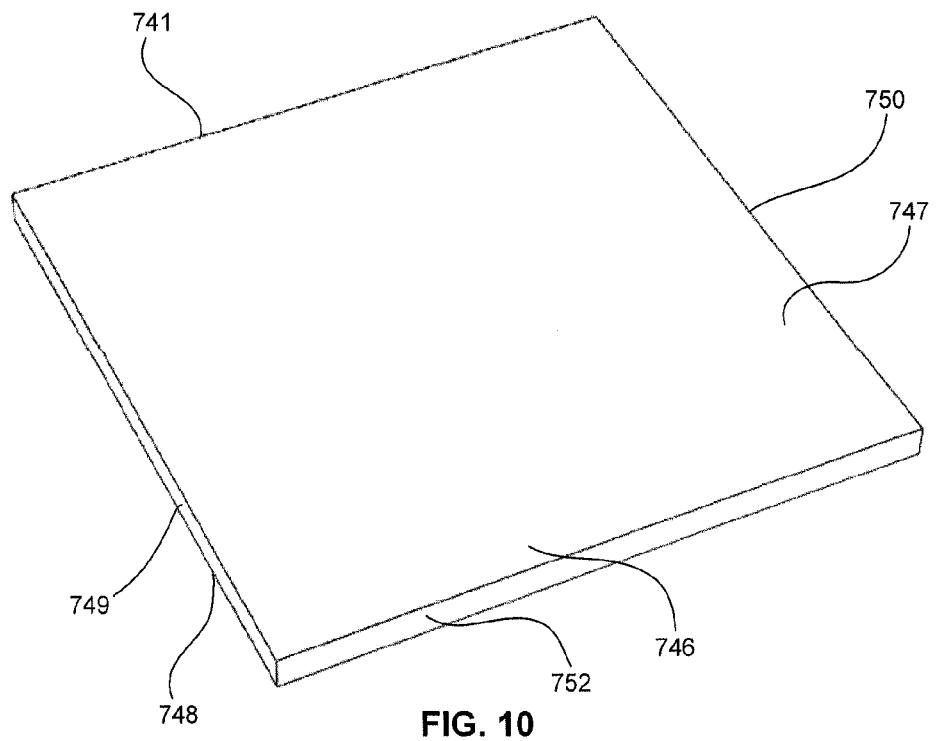
Figure 10A:
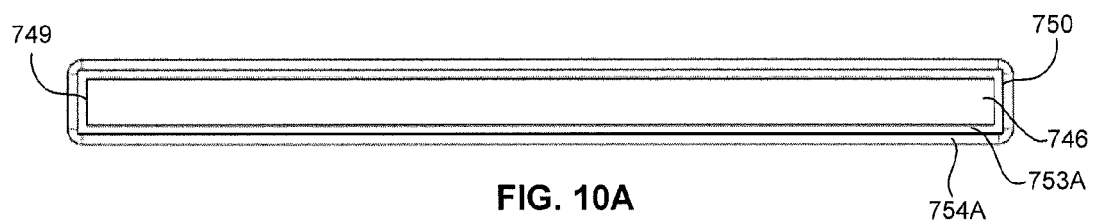
Figure 10B:
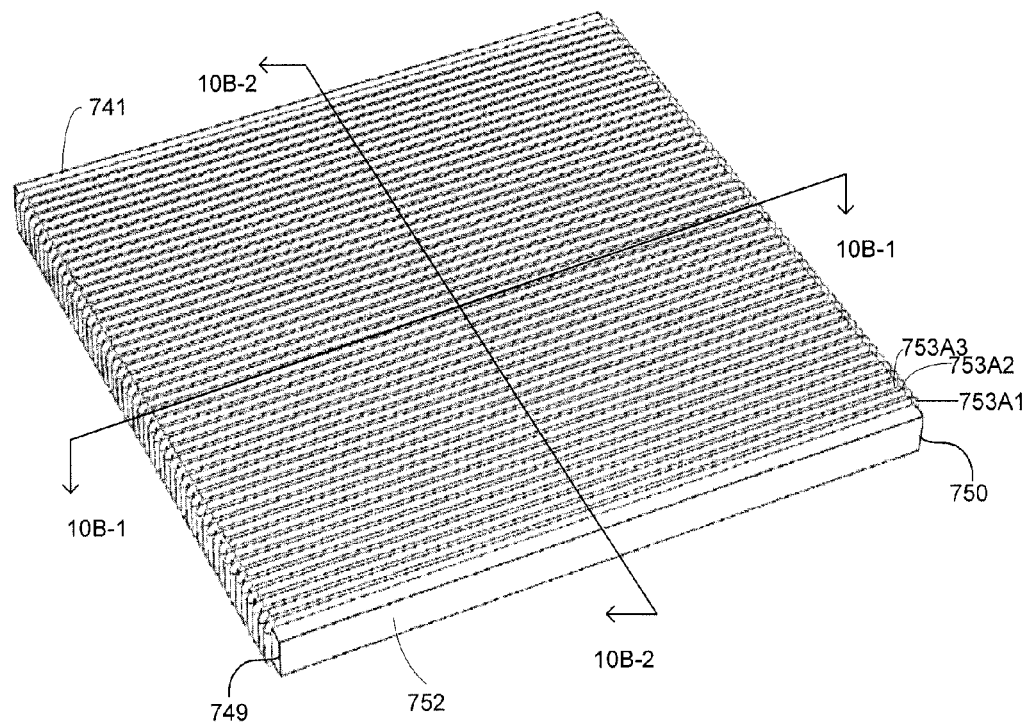
Figures 1, 10B:
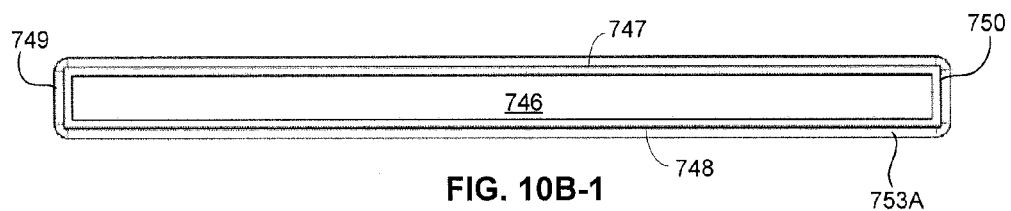
Figures 2, 10B:
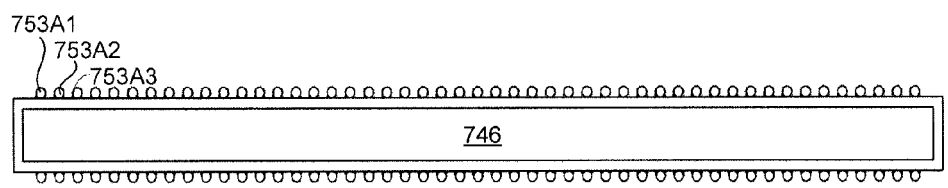

Referring first to FIG. 1, there is shown an interconnection element 100 with encased interconnects or conductors 102 in accordance with one embodiment. The interconnection element 100 may be in the shape of a square, but any desired shape of interconnection element may be obtained. The interconnection element seen in FIG. 1 is comprised of a unitary dielectric body 116 including a dielectric insulating material, which insulates respective conductors 102 from one another. In an exemplary embodiment, the dielectric material of the unitary dielectric body 116 can be a polymeric material or a composite material such as a reinforced polymeric material. In a particular example, the polymeric material can be or include a thermoplastic or thermoset plastic material which binds the conductors 102 together in the unitary dielectric body 116. In another example, the dielectric material can be or include a dielectric material which has a coefficient of thermal expansion of less than 10 parts per million per degree Celsius (hereinafter "ppm/° C."), such as glass or ceramic material, among others. In one example, the dielectric material can be or include a liquid crystal polymer material. The interconnection element 100 may have a dimension X1 that is 500 millimeters and a dimension X2 that is also 500 millimeters, but any desired dimensions may be used. For example, in a finished product the interconnection element 100 may be a few millimeters to a few tens of millions of millimeters. Additionally, the interconnection element 100, as well as the metal conductors 102 within the interconnection element, may have a thickness X3 that is less than 0.5 millimeters. The overall shape of the interconnection element need not be square. In one example, the dimensions X1 and X2 are not the same.

Encased interconnects or conductors 102 are shown embedded within the dielectric material. As will be discussed in more detail herein, the conductors 102 may be conductor portions that include severed portions of elongated metal conductors 104 (FIG. 2) encased within the dielectric material. The conductors 102 can be arranged in any pattern. For example, the conductors may be arranged in regular rows in which conductors therein are equally spaced apart and all positions of each row being occupied by a conductor 102. Alternatively, in the case shown in FIG. 1, there may be a portion or row of the interconnection element in which one or more positions of a row is missing one or more conductors. For example, at position X in bottom row 111 of conductors 102, there is at least one missing conductor.

Figure 1A:
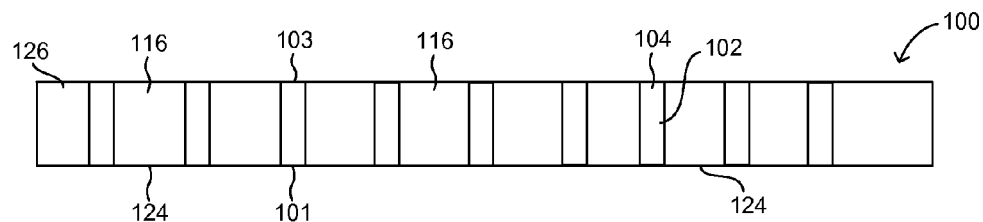
FIG. 1A is a cross-sectional view taken along line A-A of FIG. 1.
Figure 1B:
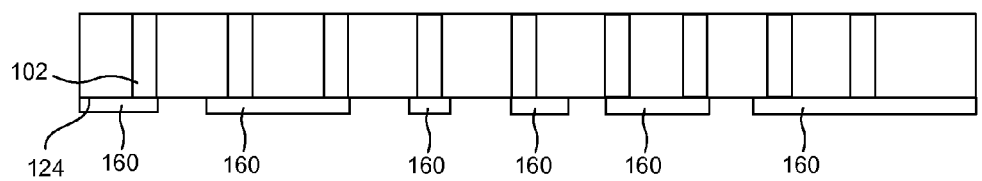
FIG. 1B is an alternative embodiment of FIG. 1A.

Turning now to FIG. 1A, in a corresponding cross-section through line A-A of FIG. 1, interconnection element 100 is free from any electrically conductive interconnects running between encased portions 102 of the metal conductors 102 or elsewhere in an at least partially lateral direction (parallel to the first and second surfaces 124, 126 of interconnection element 100) within the dielectric body 116 of the interconnection element 100 between the end surfaces 101, 103 of the conductors 104. As shown in FIG. 1B, traces 160 or the like can be used to form connections running in a lateral direction outside of the area that lies between end surfaces 101, 103. In an example, there are no lateral connections within the dielectric body 116 of the interconnection element 100. In another example, within dielectric body 116, the only connections formed are by the portions 102 of metal conductors 104 between the first surface 124 and second surface 126 of the interconnection element 100.

Figure 1C:
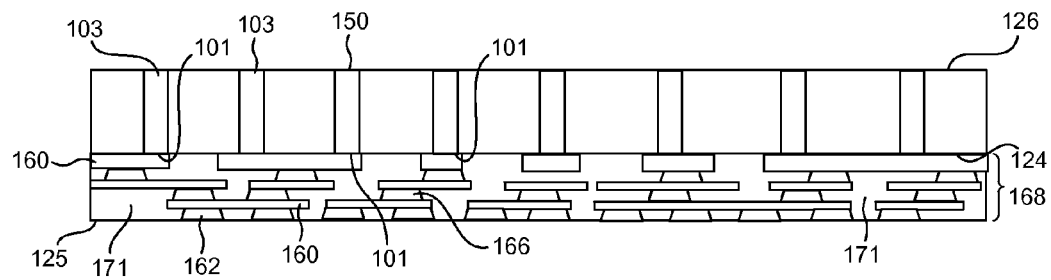
FIG. 1C is an alternative embodiment of FIG. 1A.

In the interconnection element of FIG. 1C, end surfaces 103 of conductor portions 102 can be wettable contacts 150 usable to join conductor portions 102 to another component using solder or other conductive materials. For example, in FIG. 1F, end surfaces 103 of conductor portions 102 are joined to solder balls 154, which are, in turn, joined to contacts 180 on a circuit panel, e.g., a PCB 178 or other component. In one example (not shown), on an interconnection element 100 (FIGS. 1-1A), end surfaces 101 of metal conductors 104 can be joined to solder balls 154, which, in turn, can be joined to contacts 176 on a microelectronic element 174. Other materials can be used in place of solder to join features of the components of the assembly such as tin, indium, a conductive paste or a conductive matrix material. Additional wettable metal layers or structures can be added to interconnection element 100 that can be wettable contacts for connection to other microelectronic components. Such wettable metal layers or structures can be a noble metal or alloys thereof, such as copper, nickel, gold, or platinum palladium, among others. In one example, an organic solderability preservative ("OSP") can coat a metal contact to avoid oxidation and to preserve the wettability of the metal contacts.

In variations of the interconnection element 100 (FIGS. 1-1A), structures that can be wettable contacts include portions of traces or contact pads or pads 162 that can be patterned with traces 160 or can overlie surfaces 124 or 126 of the dielectric body.

In the embodiment shown in FIG. 1C, wettable contacts can be provided as contact pads 162, electrically interconnected with end surfaces 101 through traces 160 and other electrically conductive structures, e.g., conductive vias 166. In one example, traces 160 can electrically connect to and overlie respective end surfaces 101 and extend away therefrom in a direction parallel to surface 124 in a redistribution layer 168. Traces 160 can be used to provide a wettable contact at a laterally offset position from the location of end surface 101. In the embodiment shown in FIG. 1C, multiple layers of traces 160 are formed within or on a redistribution dielectric 171 of redistribution layer 168; however, a single layer could be used to achieve a desired offset configuration. The layers of traces are separated from one another by portions of the redistribution dielectric 171 that extend between the traces 160 both in different layers and within the same layer. The traces 160 are connected, as desired, between layers using conductive vias 166, which are formed through portions of redistribution dielectric 171.

Traces 160 can have different widths, including widths which are smaller or larger than the widths of end surfaces 101,103 of metal conductors 102. This facilitates fabrication of an interconnection element having high routing density. Generally, the widths of traces 160 are selected in a range from about 5 to 100 μm (e.g., 20-40 μm); however, portions of traces (such as portions of traces 160 or contact pads 162 used as wettable contacts) or some traces themselves can have widths greater than 100 μm. Together with the metal conductors 102, traces 160 can form an electrical circuit of interconnection element 100. Each trace 160 can be connected to at least one metal conductor 102 or to at least one other trace. However, some traces can "float," in that they can be electrically disconnected from posts and other traces. Likewise, one or more of the posts can remain unconnected to any traces. Other metal structures such as ground planes or ground rings may also be provided in a metal layer that includes the traces 160 or contacts 162.

Figure 1D:
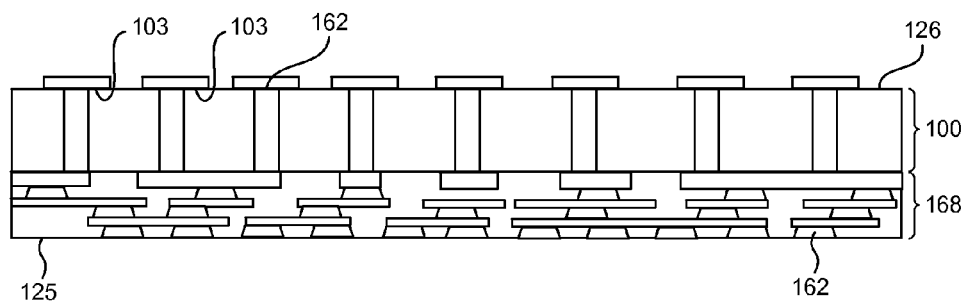
FIG. 1D is an alternative embodiment of FIG. 1A.

An embodiment of interconnection element 100 having one or more redistribution layers 168 can allow interconnection element 100 to be used to connect to a microelectronic component having a different connection configuration than the configuration of metal conductors 104. In particular, interconnection element 100 can be configured with a redistribution layer that results in wettable contacts having different pitches above or at surfaces 124,126 of the component. As shown in FIG. 1C, the pitch of end surfaces 101 used as wettable contacts formed on the first surface 124 is greater than the pitch of the wettable contacts formed by vias 166 on the surface 125 of redistribution layer 168. The embodiment shown in FIG. 1D is similar in this respect, in that the pitch of the wettable contacts that are the contact pads 162 on surface 126 of the interconnection element 100 is greater than the pitch of the wettable contacts that are pads 162 on the surface 125 of the redistribution layer 168.

Figure 1E:
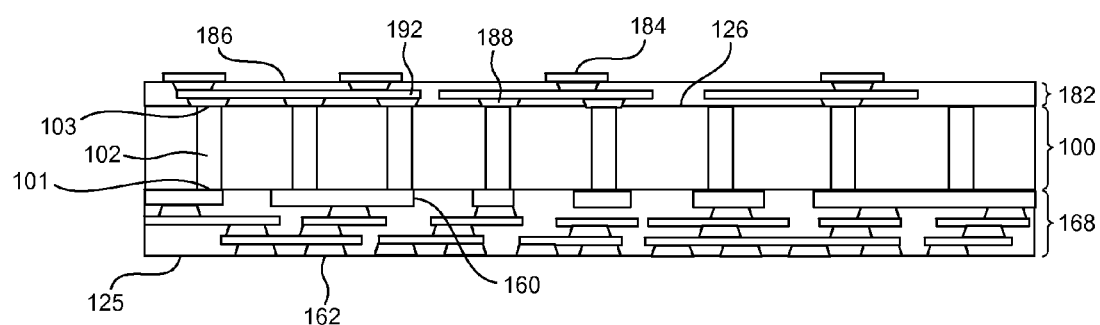
FIG. 1E is an alternative embodiment of FIG. 1A.
Figure 1F:
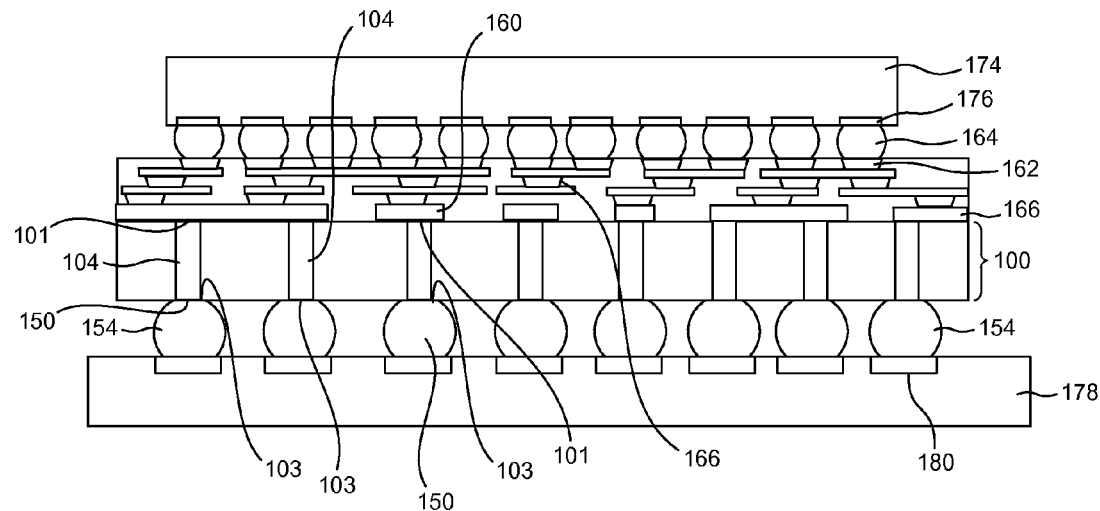
FIG. 1F is an alternative embodiment of FIG. 1A.
Figure 1G:
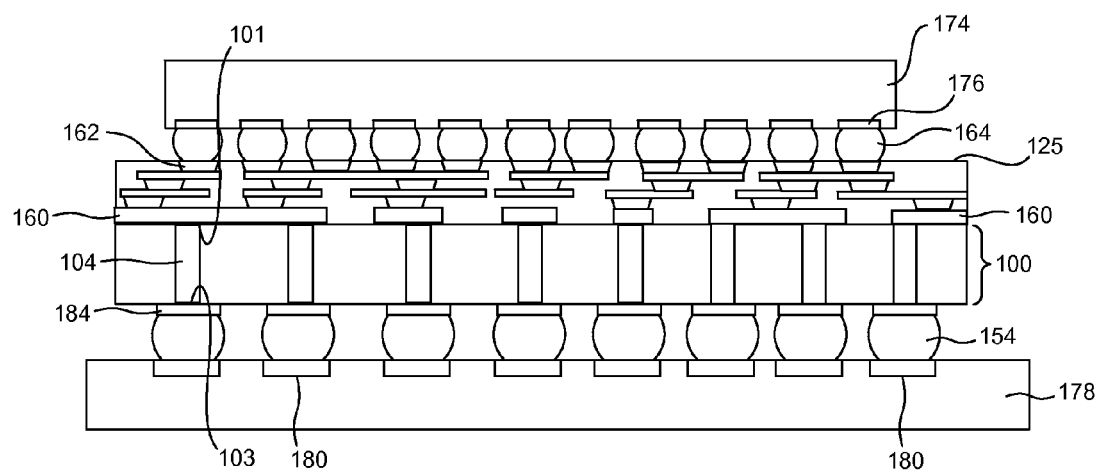
FIG. 1G is an alternative embodiment of FIG. 1A.

As shown in FIGS. 1F and 1G, interconnection element 100 in either of the forms shown in FIGS. 1F and 1G, respectively, can be used to connect two components with respective contacts having different pitches or other different configurations. In the example shown in FIG. 1F, microelectronic element 174 has contacts 176 having a smaller pitch than the pitch of contacts 180 on PCB 178. Contacts 180 of PCB 178 are joined to end surfaces 103, which act as wettable contacts therefor, and contacts 176 of microelectronic element 174 are joined to contact pads 162 exposed at the surface 125 of the redistribution layer 168 of interconnection element 100, which is inverted with respect to the depiction of FIG. 1C. The embodiment shown in FIG. 1G is similar to that which is shown in FIG. 1F, except that contact pads or pads 184, which overlie end surfaces 103, act as wettable contacts for attachment to contacts 180 of PCB 178 using solder balls 154.

FIG. 1E shows an embodiment of interconnection element 100 having a second redistribution layer 182 formed along the second surface 126 of the interconnection element 100. The second redistribution layer 182 is similar to the first redistribution layer 168, except that, in the embodiment shown, contacts 184 overlie portions of the second surface 186 of the interconnection element 100. Contact pads 184 are connected to respective end surfaces 103 of metal conductors 102 by traces 192 and additional conductive vias 188 formed within redistribution dielectric 194. Further, pads 184 can be offset from respective end surfaces 103 to which they are electrically connected so as to be useable as wettable contacts on surface 186, which is a different configuration than end surfaces 103. In the embodiment shown, the wettable contacts formed by contact pads 184 have a greater pitch than end surfaces 103 and an even greater pitch than that of the contact pads 162 on the surface 125 of the first redistribution layer 168 that are useable as wettable contacts on surface 125. Such an arrangement can be used to form pitches for wettable contacts that differ between their respective surfaces by a factor of at least 1.5 and, in some embodiments, a factor of at least about 2. It is noted that contact pads 184,162 can overlie and connect directly to vias 166,188. Alternatively, pads 190 can be connected directly to traces 160 either by a form of bonding or by being integrally formed therewith and exposed at either of surfaces 186 and 125. The embodiment of interconnection element 100 shown in FIG. 1E can be used in an assembly for attachment between a microelectronic element and a PCB in a similar arrangement, as shown in FIGS. 10F and 10G, and can allow for an even greater difference in pitch between the conductive features of the microelectronic element and the PCB.

Microelectronic elements, or devices, can be mounted on the substrates using techniques such as ball-bonding, as shown, or using other techniques. Similarly, such techniques may be used for connecting the substrates stacked on one another as additional components to the assemblies shown herein. Further examples of such assemblies are shown and described in U.S. Pat. No. 7,759,782 and in U.S. Pat. Appln. Pub. No. 2010/0273293, the disclosures of which are hereby incorporated by reference herein in their entireties. For example, an interconnection element can be disposed on and connected to a PCB that includes an electrically conductive plane or EMI (electromagnetic interference) shield. The end surfaces of the posts can then be solder-bonded to contact pads of the PCB with the EMI shield being ball-bonded to a peripheral trace of the interconnection element for grounding to the shield. Further, the interconnection elements discussed herein can be interconnected to form multi-interposer assemblies. Such an assembly can include two interconnection elements that overlie each other. One of the stacked interconnection elements can, for example, have a recess formed in the molded dielectric layer thereof to receive, without electronic connection to, a microelectronic package bonded to the other interconnection element.

Figure 2:
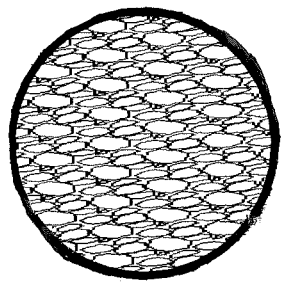
FIGS. 2, 2', 2A, 2B, 2C, and 2D illustrate steps in one embodiment of making the interconnection element of FIG. 1.
Figure 2C:
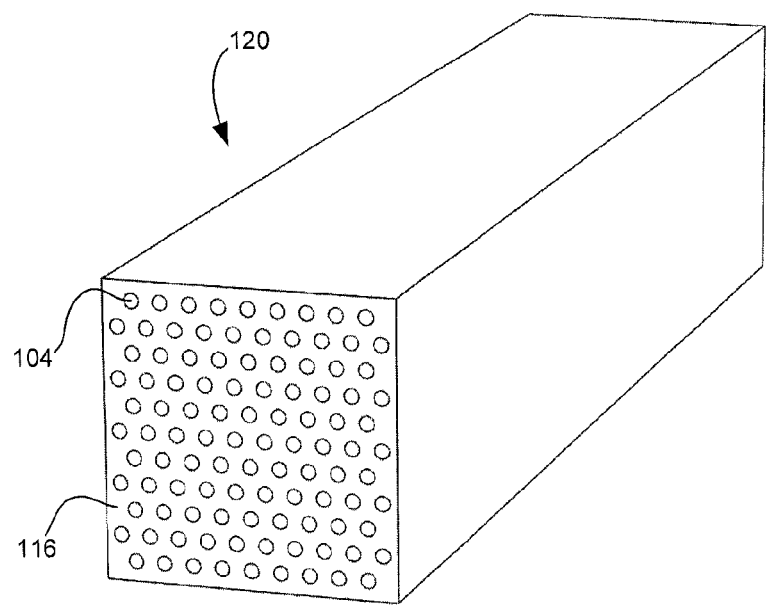
FIG. 2E is an alternative embodiment of FIG. 2D.
Figure 2D:
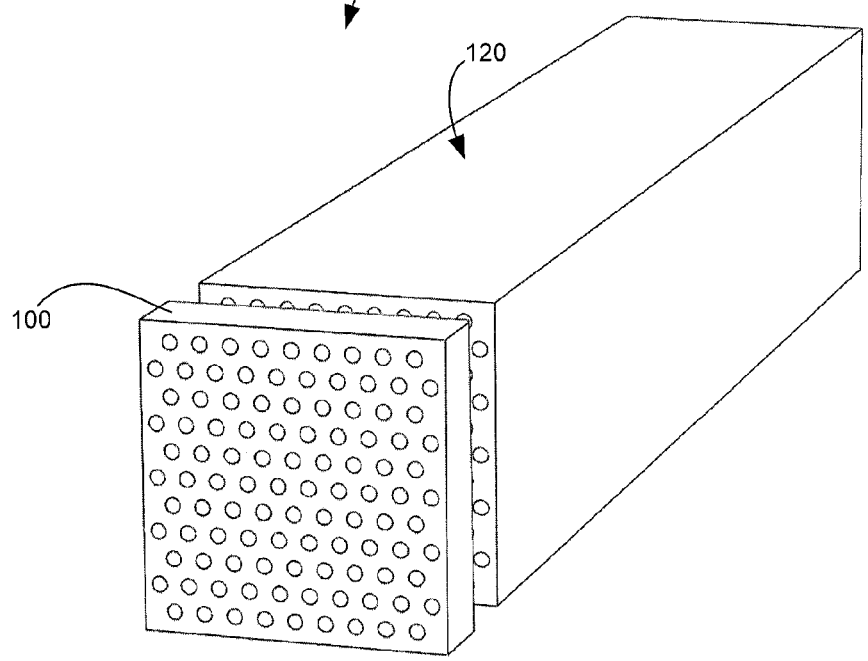

Referring now to FIGS. 2-2D, one embodiment of making the interconnection element 100 is shown. Turning first to FIG. 2, a metal conductor 104 is shown. The conductor 104 has a first end 106, a second end 108, a circular cross-section, and an outer surface 109. In one embodiment, the diameter of the conductor 104 can be less than 100 microns, for example. In particular embodiments, the diameter of the conductor may range from 15 microns to 100 microns. In examples, the conductor 104 can include a metal such as copper, nickel, silver, aluminum, or an alloy of one or more such metals. Conductor 104 typically is in the form of an extruded or drawn wire having been made by a known extrusion process. As best shown in the exploded view of FIG. 2', the extruded structure of conductor 104 includes metal grains that are elongated in a longitudinal direction 107 of the wire. This results in grains oriented in direction 107 between the first end 106 and second end 108. The orientation of the grains is in contrast to a conductor formed from plated metal, which results in grains typically having a uniform size in all directions. Conductors 104 with this structure may have a substantially constant cross-section or diameter. In one embodiment, a tolerance of the diameter may be 1 micron for a conductor having a diameter of 50 microns. The conductor 104 may have a strength greater than 100 MPa, such that the conductor 104 is not compliant. The surface roughness of the conductor may be less than 1 micron.

As shown in FIG. 2A, an insulated conductor 110 has a first end 112 and a second end 114. The insulated conductor 110 is comprised of the conductor 104, as well as an insulating dielectric material that coats or surrounds the outer surface 109 of conductor 104. The insulating material can be arranged around the conductor 104 so that the insulated conductor 110 can also maintain a relatively constant diameter. In one embodiment, the dielectric material has a thickness T extending from the outer surface 109 of the conductor 104. In one embodiment, the thickness T of the dielectric 116 can range from a few tens of microns to 1000 microns or more. In a particular embodiment, the thickness T can be less than 250 microns.

Referring now to FIG. 2B, a plurality of elongated insulated conductors 110 can be arranged together in a plurality of parallel rows. Each of the first ends 112 and the second ends 114 of the insulated conductors 110 can be aligned with one another so that each of the first ends 112 and second ends 114 are flush with one another. As shown, in this embodiment, the insulated conductors 110 can be arranged parallel to one another to achieve a uniform spacing between the conductors, as seen in the stacked arrangement 132 of FIG. 2B. In a particular embodiment, the insulated conductors 110 can be placed in a "honeycomb" arrangement wherein a given insulated conductor 110A at an interior location of the arranged conductors contacts six other insulated conductors 110B of like construction.

As shown in FIG. 2C, the dielectric 116 material is treated to form a unitary body 120 with conductors 104 encased therein. For example, the array can be treated by heat, pressure, or a combination of heat and pressure to form the unitary body. In a particular embodiment, energy may be applied to the arrangement via other means, for example, ultra-sonic, radio frequency, or ultraviolet radiation to effect reflowing or curing of the dielectric material. The unitary body 120 can then be severed to form an individual interconnection element 100 or a component as seen in FIG. 1, having portions 102 of the encased conductors 104 which are severed from the unitary body 120. In one embodiment, the unitary body is severed in a direction transverse to the lengths of conductors to form the at least one interconnection component having severed portions of the conductors exposed at its first and second opposed surfaces. In this embodiment, the thickness of the interconnection element between the first and second opposed surfaces may be less than 0.5 millimeters.

Figure 2E:
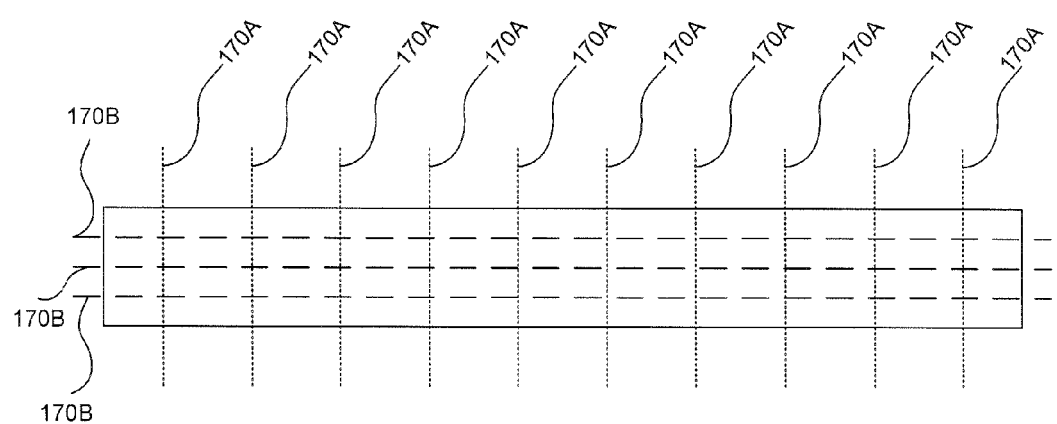

It is to be appreciated that after formation of the unitary body 120, the unitary body 120 may be cut into any desired shape or size. For example, in the variation shown in FIG. 2E, a top plan view of the unitary body 120 is shown. In addition to cutting the unitary body 120 along horizontal dicing lanes 170A, as in the previous embodiment, the unitary body 120 may also be cut along longitudinal dicing lanes 170B-E, which is along the same direction as the grains of the metal conductors, or only cut in the longitudinal direction. Alternatively, the unitary body 120 may only be cut along longitudinal dicing lanes or there may be additional cuts in a direction transverse to the horizontal dicing lanes of the previous embodiment, so that the interconnection element may be cut into a checkerboard pattern. Any desired configuration that can form the unitary body is contemplated.

Figure 3:
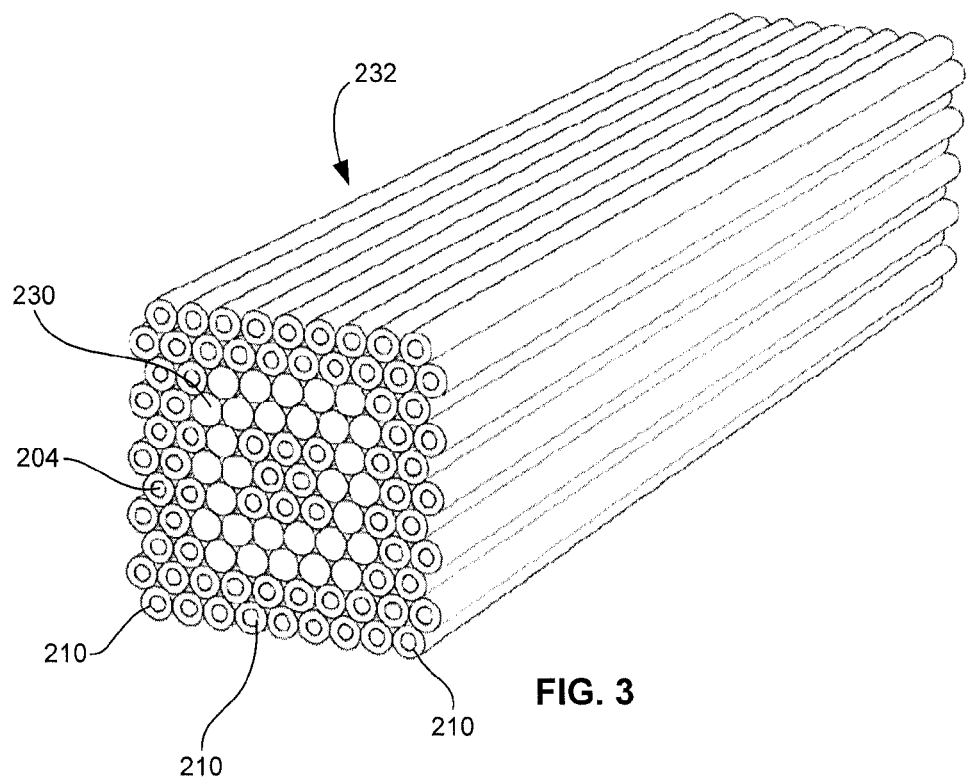
FIGS. 3, 3A, and 3B illustrate an alternative method of making an alternative interconnection element.
Figure 3A:
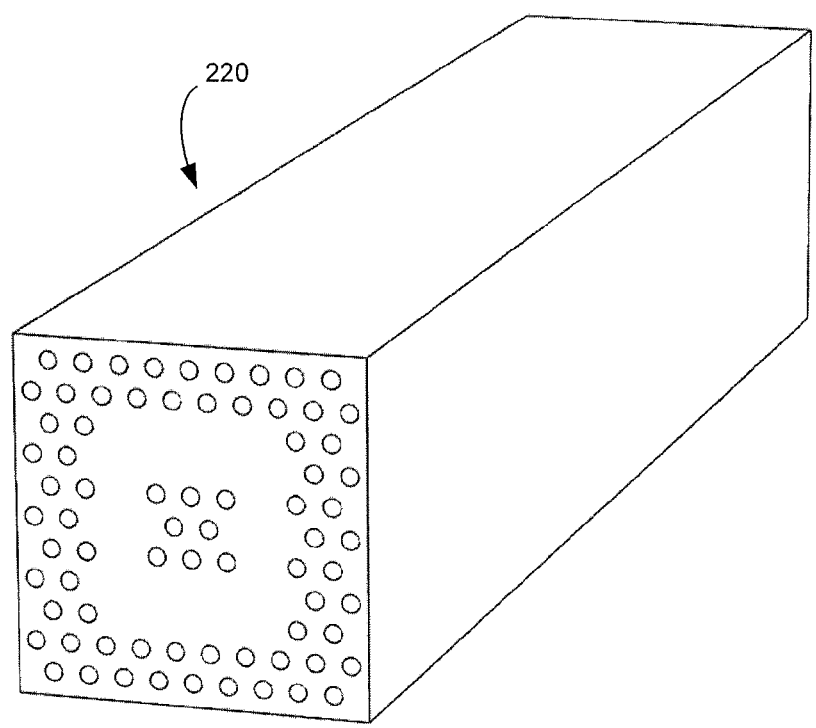
Figure 3B:
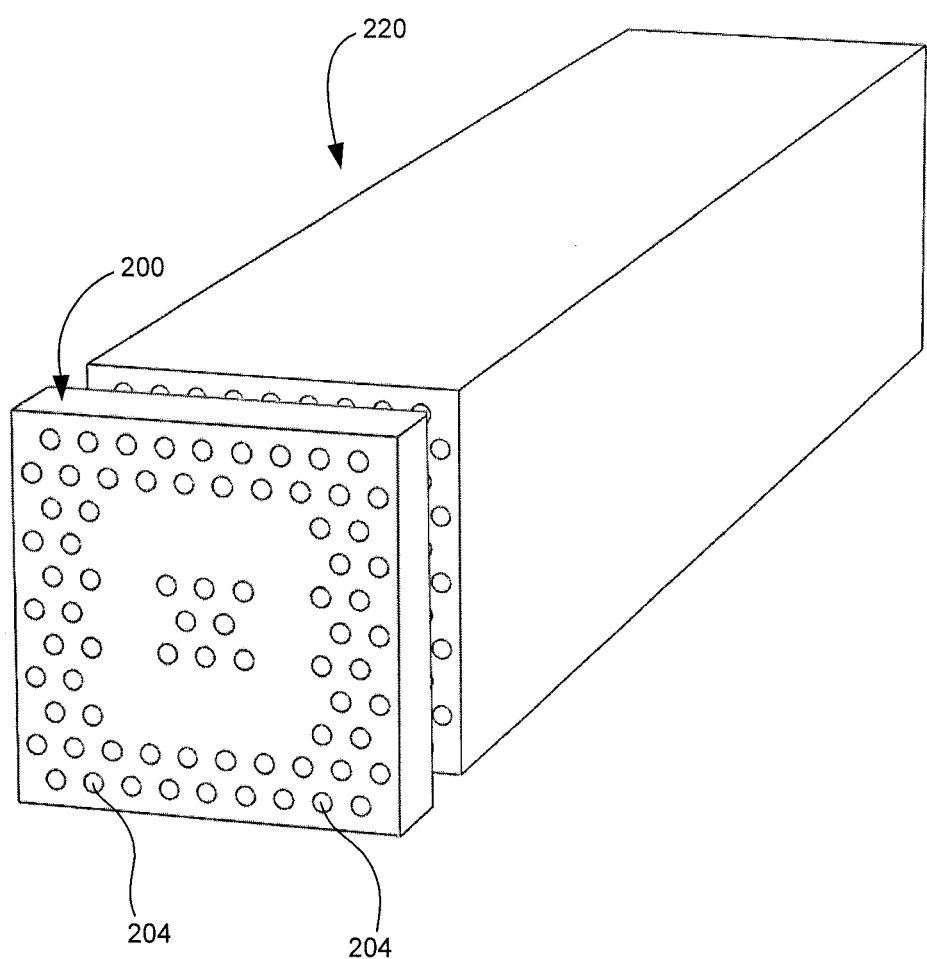

Turning now to FIGS. 3-3B, a method of making an alternative interconnection element 200 (FIG. 3B) is shown. As best seen in FIG. 3, the interconnection element 200 can be formed from an arrangement of both insulated conductors 210 and insulating dielectric rods 230. The dielectric rods 230 may be arranged relative to the insulated conductors 210 in any desired manner. In one representative exemplary embodiment, the insulated conductors 210 are positioned near a central portion of the overall stacked arrangement 232. The central portion of the stacked arrangement 232 is comprised of three rows of insulated conductors. Each of these three rows includes at least two insulated conductors. Dielectric rods 230 are then arranged peripheral to each of the central insulated conductors. As shown, the dielectric rods 230 can form a square around the insulated conductors 210. A plurality of insulated conductors 210 is then arranged peripheral to the rods.

Once the plurality of insulated conductors 210 and dielectric rods 230 are arranged, the dielectric 216 material within the insulated conductors 210 and the dielectric rods 230 can be treated to form the unitary body 220 seen in FIG. 3A. The unitary body 220 can then be severed to form individual interconnection elements 200 of varying thicknesses. In one example, the unitary body 220 can be severed in a direction transverse to the lengths of the insulated conductors 210 to form an interconnection component that has severed portions of the conductors exposed at first and second opposed surfaces. In this example, the thickness of the interconnection element 200 may be less than 0.5 millimeters.

Figures 4, 4A:
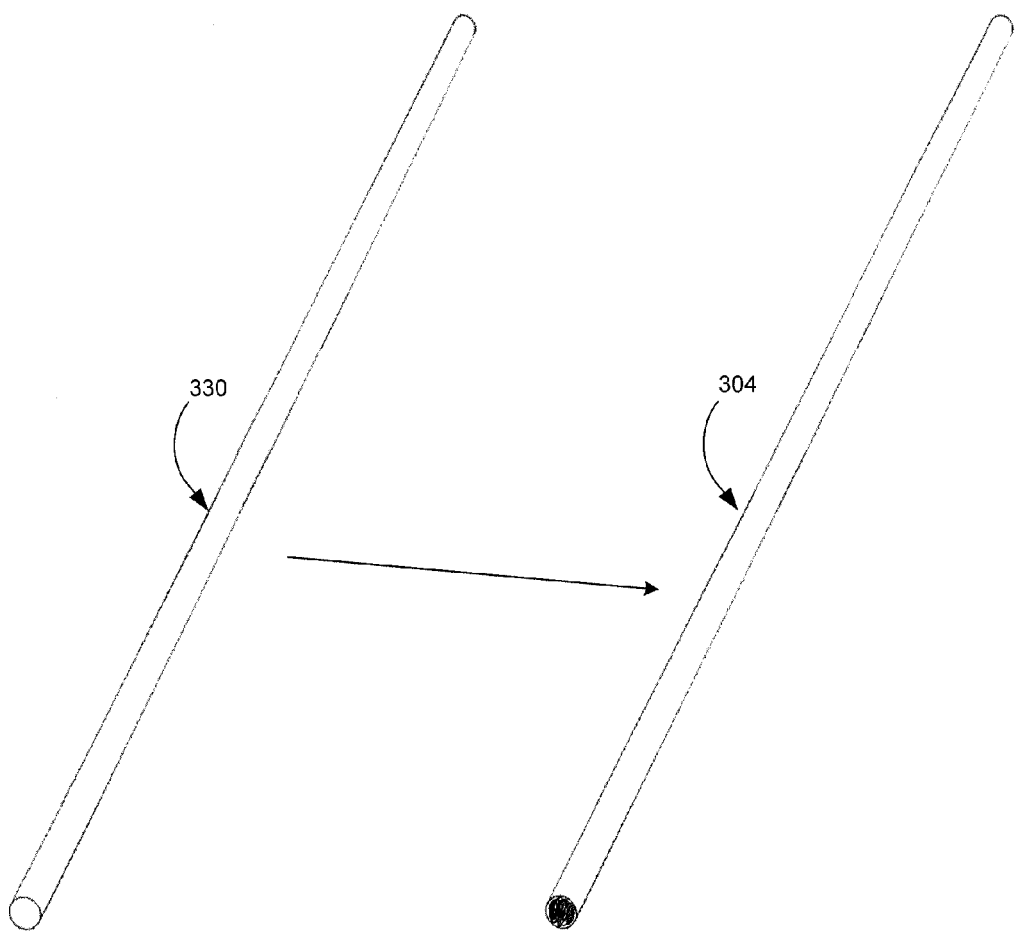
FIGS. 4, 4A, 4B, 4C, and 4D illustrate an alternative method of making the interconnection element of FIG. 1.
Figures 4B, 4C:
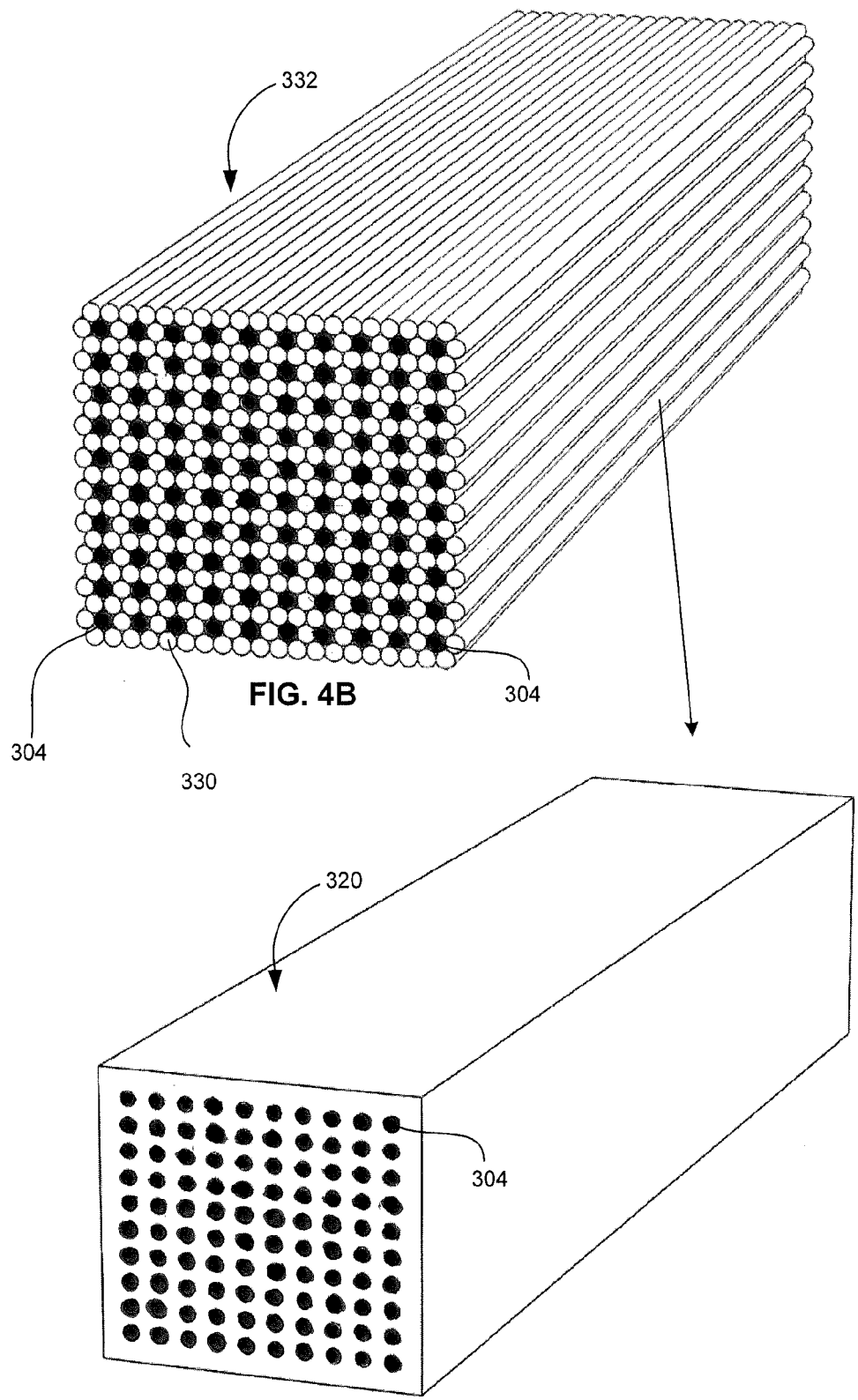
Figure 4D:
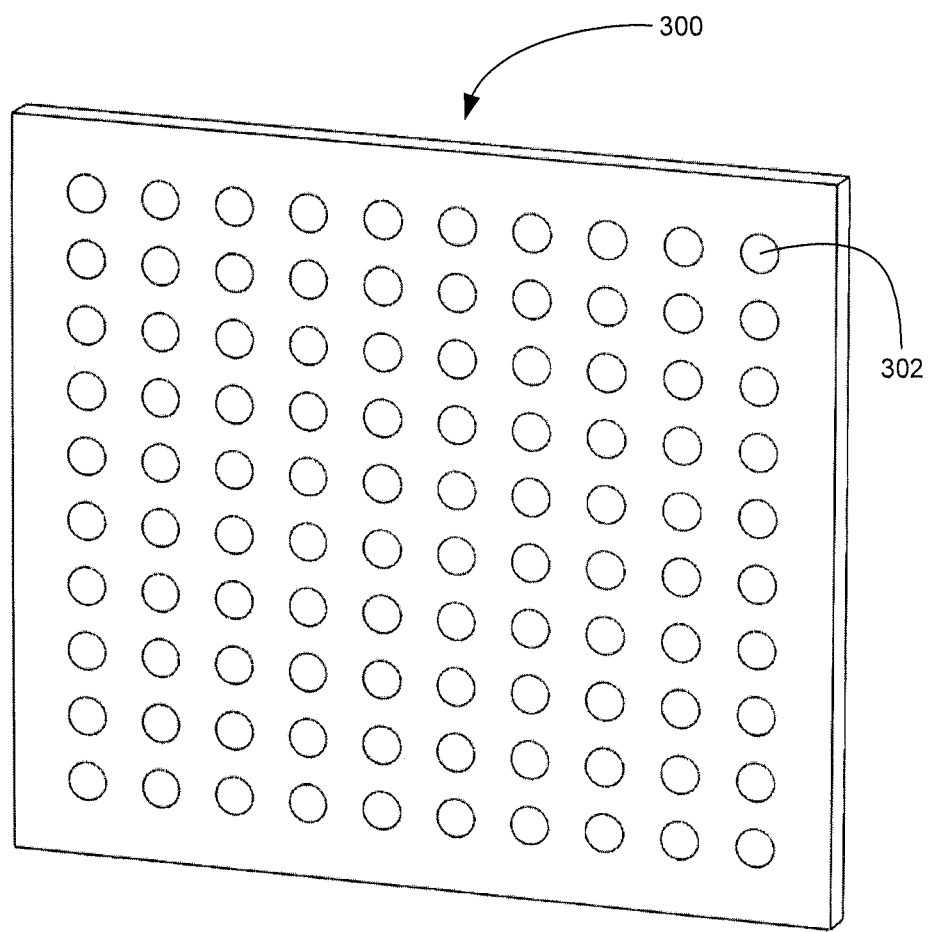

Turning now to the embodiment of FIGS. 4-4D, an alternative method of forming an interconnection element is shown. Referring to FIG. 4, a dielectric rod 330 comprised of a dielectric material is shown. FIG. 4A illustrates an extruded metal conductor 304, as previously disclosed herein, that is comprised of a metal or metal alloy. A plurality of dielectric rods 330 and metal conductors 304 can be arranged in any desired pattern to provide for an interconnection element 300 (FIG. 4D) with encased interconnects 302. As shown in the stacked arrangement 332, alternating patterns of dielectric rods 330 and metal conductors 304 are provided. A first row is comprised of an entire row of dielectric rods 330. A second row can be comprised of both dielectric rods 330 and metal conductors 304, such that every other rod is a dielectric rod, and between each dielectric rod is a metal conductor 304. Every other row can be comprised of dielectric rods, and each row between the rows of dielectric rods 330 can be a combination of metal conductors 304 disposed between dielectric rods 330. It is to be appreciated that the conductors 304 do not have to be evenly spaced or take on a geometric configuration.

Once the desired number of rows is vertically stacked to provide for the appropriate or desired size of the interconnection element, the dielectric rods 330 may be treated to form the unitary body 220 shown in FIG. 4C. In this embodiment, the resulting interconnection element 300 (FIG. 4D) is similar in shape and pattern to the interconnection element 100 shown in FIG. 1. It differs only in the manner in which the interconnection element is formed, and also in the pattern of the conductors. As shown, each row does not have an identical number of conductors. For example, one may have nine conductors, instead of ten as in the other rows.

Figures 5, 5A:
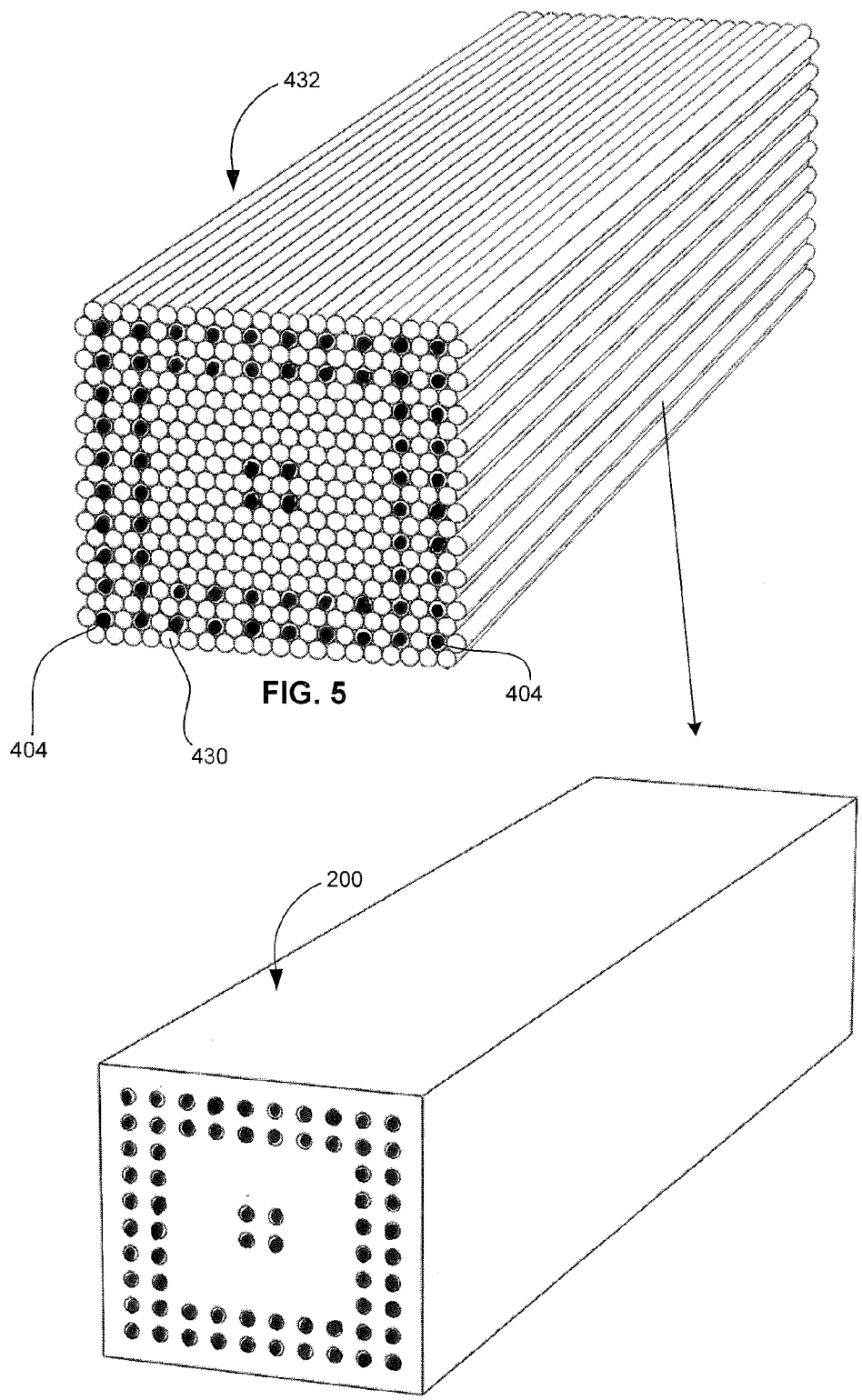
FIGS. 5, 5A, and 5B illustrate an alternative method of making an alternative interconnection element.
Figure 5B:
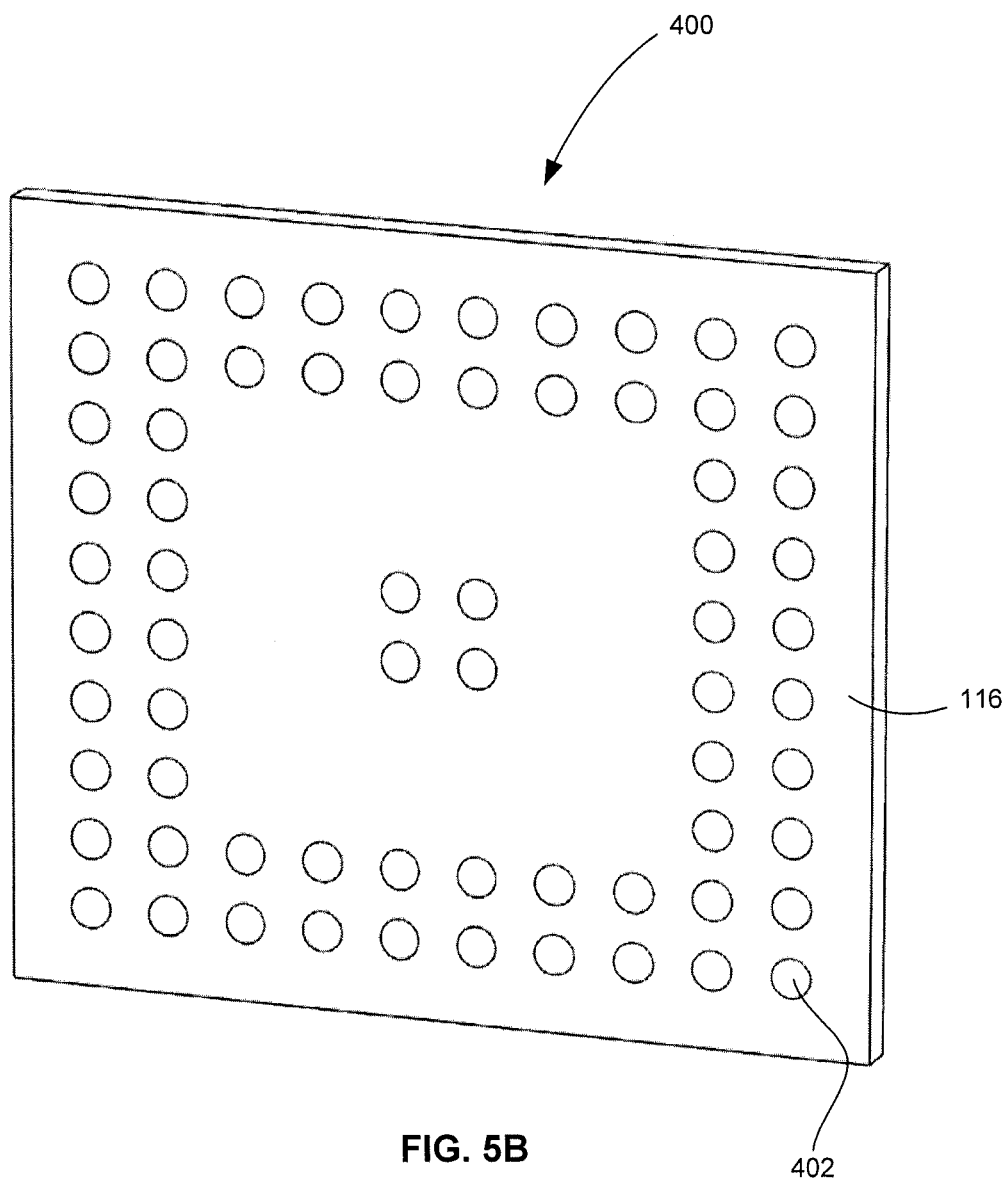

It is to be appreciated that the metal conductors 304 and dielectric rods 330 can be in arranged in any manner which is desired. For example, referring to FIGS. 5-5B, an alternative method for forming an interconnection element 400 (FIG. 5B) is shown. Stacked arrangement 432 of the same dielectric rods 430 and metal conductors 404 is shown. In this embodiment, as shown in FIG. 5, the dielectric rods 430 and metal conductors 404 are arranged so that the metal conductors are positioned along the outer periphery and also at the central portion of the stacked arrangement 432. Upon reflow, a unitary body 420 is obtained, which illustrates the pattern of the metal conductors 404 embedded within the dielectric 416.

Figures 6, 6A:
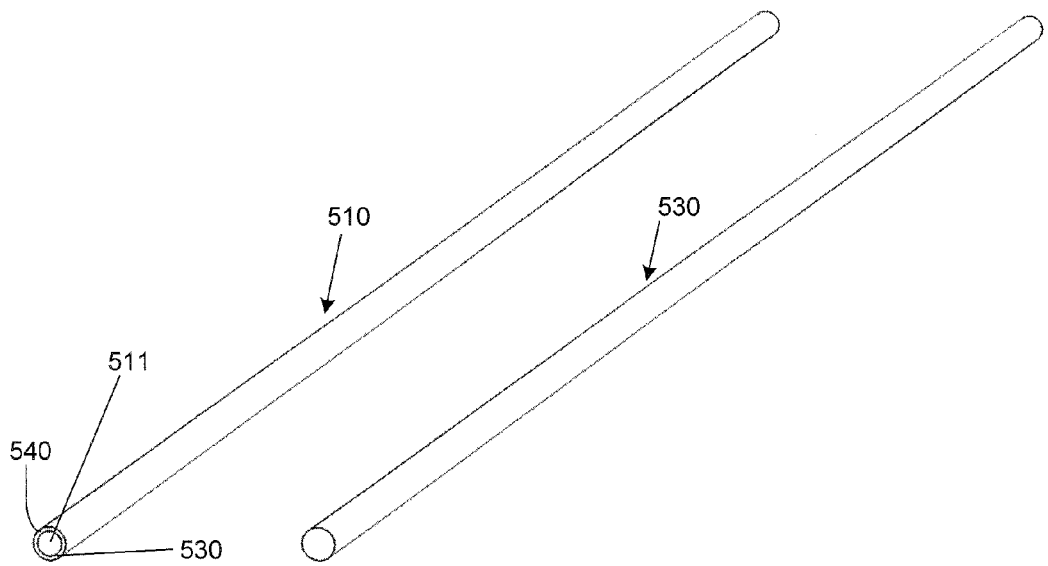
FIGS. 6, 6A, 6B, 6C, and 6D illustrate an alternative method of making an alternative interconnection element.
Figure 6B:
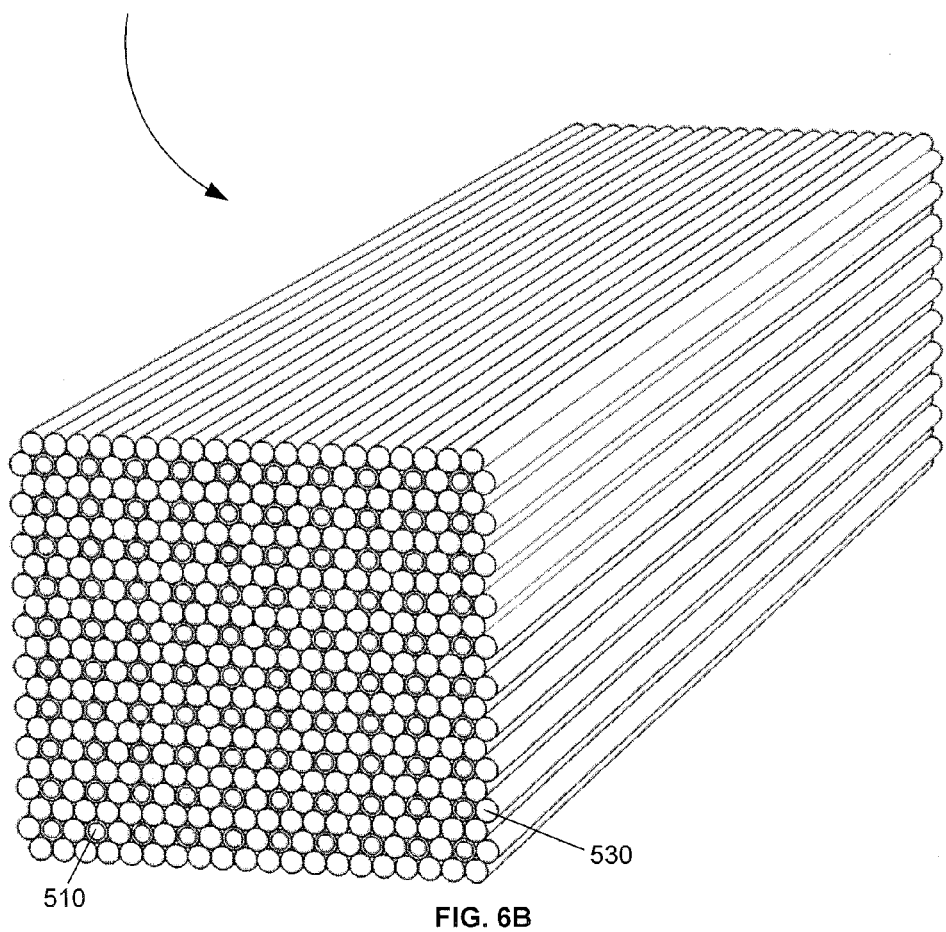
Figure 6C:
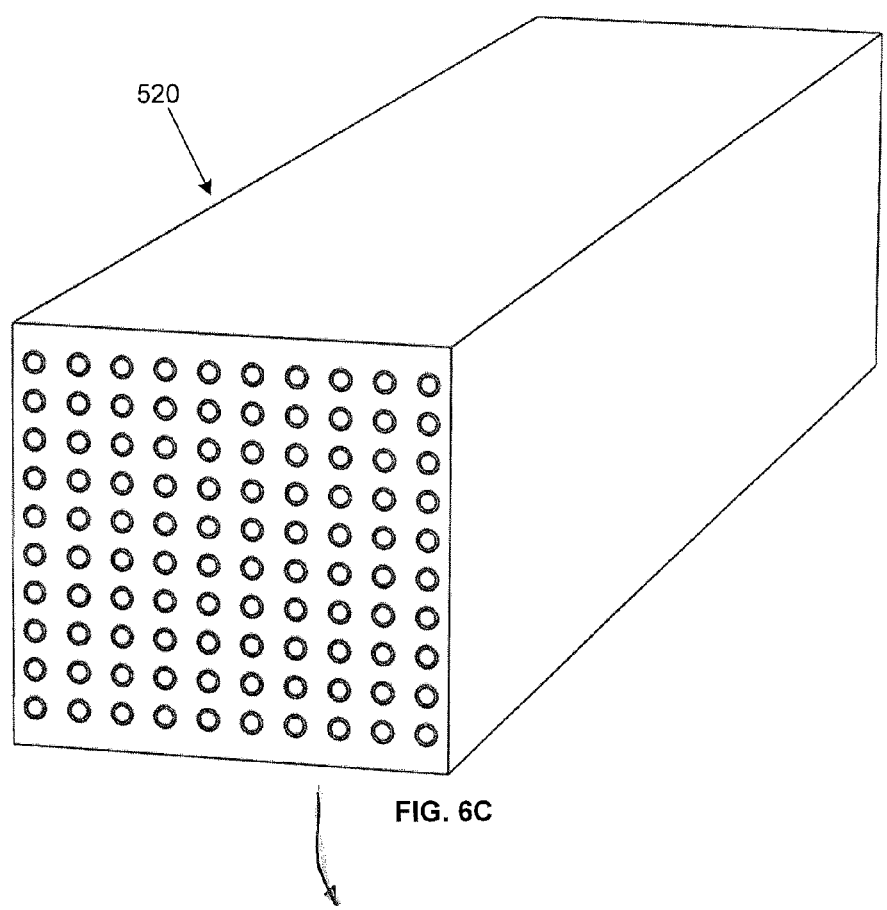
Figure 6D:
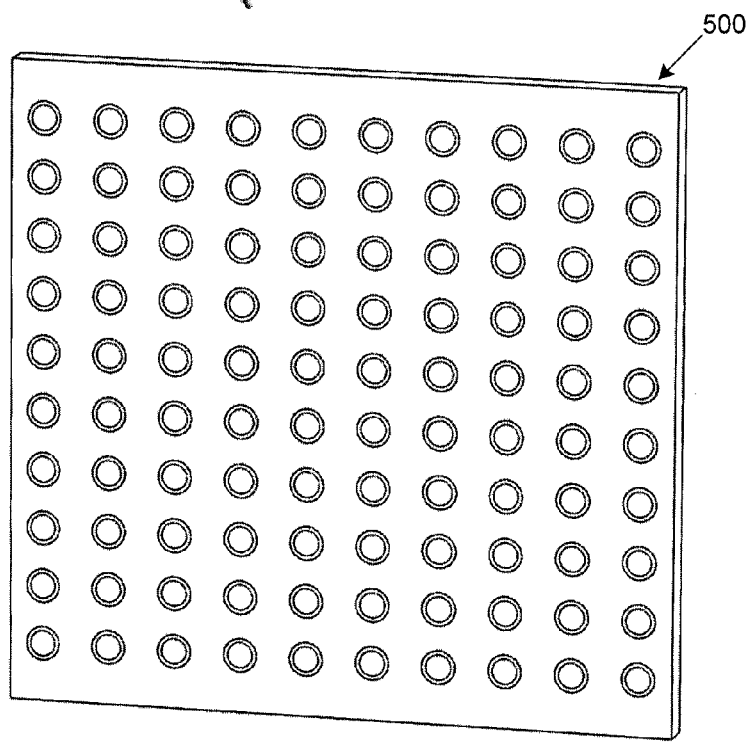

Referring now to FIGS. 6-6D, another method of making an interconnection element 500 is shown. Referring to FIG. 6, metal coated dielectric rod 510 is shown as a component used in making the interconnection element 500. The core 511 of the metal coated dielectric rod 510 is an elongated dielectric rod 530. A metal layer 540 is provided or coated around the elongated dielectric rod 530. The metal layer 540 can be plated onto the dielectric rod 530, or a layer of metal 540 may be simply coated onto the dielectric rod 530. Referring to FIG. 6A, the dielectric rod 530 is shown. A plurality of the metal coated dielectric rods 510 and other (non-metal coated) dielectric rods 530 can then arranged into a desired stacked arrangement 532, such as the stacked arrangement shown in FIG. 6B. In this embodiment, the metal-coated rods 510 are evenly spaced between dielectric rods 530. As shown, every other row in the stacked arrangement 532 is a row comprised of only dielectric rods 530. The rows intermediate the rows of only dielectric rods are comprised of both metal coated dielectric rods 510 and dielectric rods 530, wherein each of the metal coated dielectric rods 510 are positioned between dielectric rods 530, such that the metal coated rods 510 are surrounded by dielectric rods 530.

Referring to FIG. 6C, the dielectric material is treated to form a unitary body 520. Thereafter, the unitary body 520 may be cut to form individual interconnection elements, such as interconnection element 500 shown in FIG. 6D.

Figures 7, 7A:
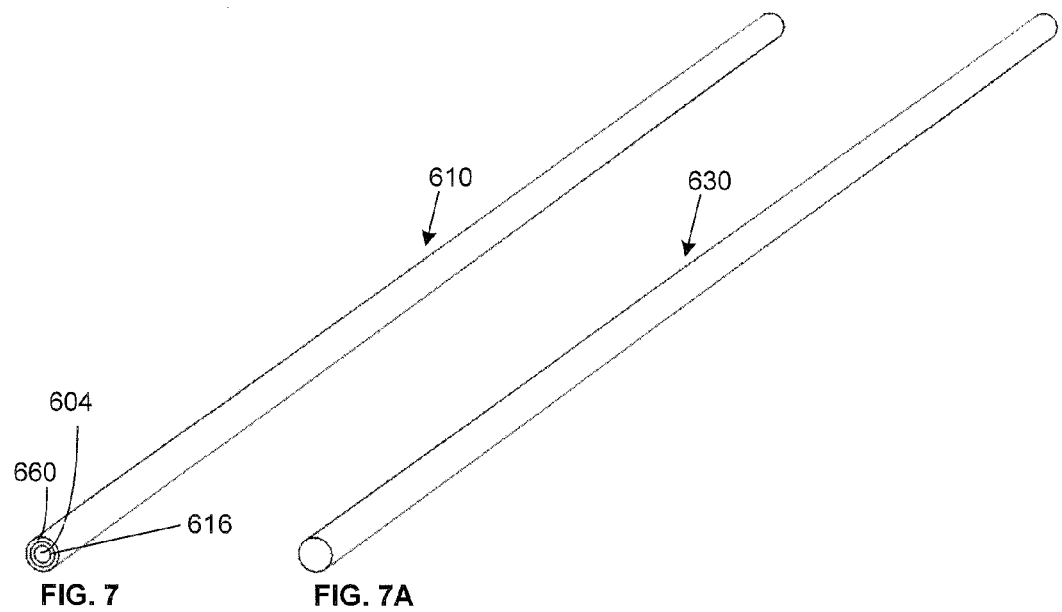
FIGS. 7, 7A, 7B, 7C, and 7D illustrate an alternative method of making an alternative interconnection element.
Figure 7B:
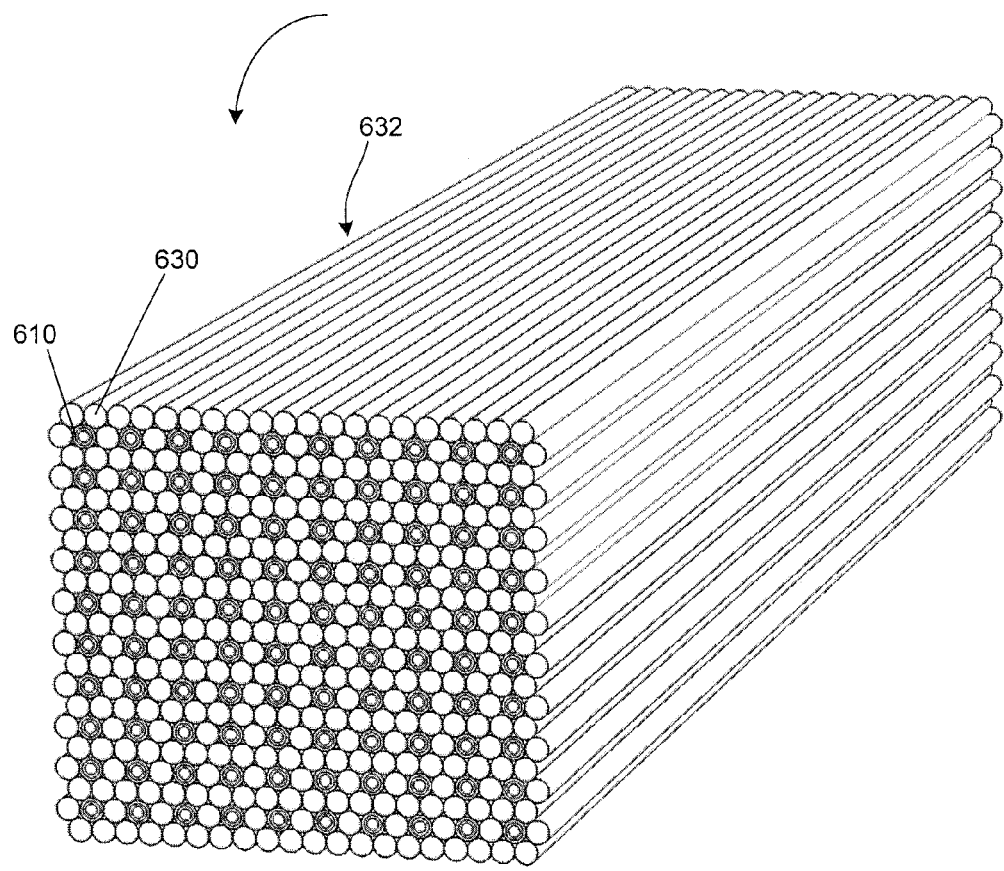
Figure 7C:
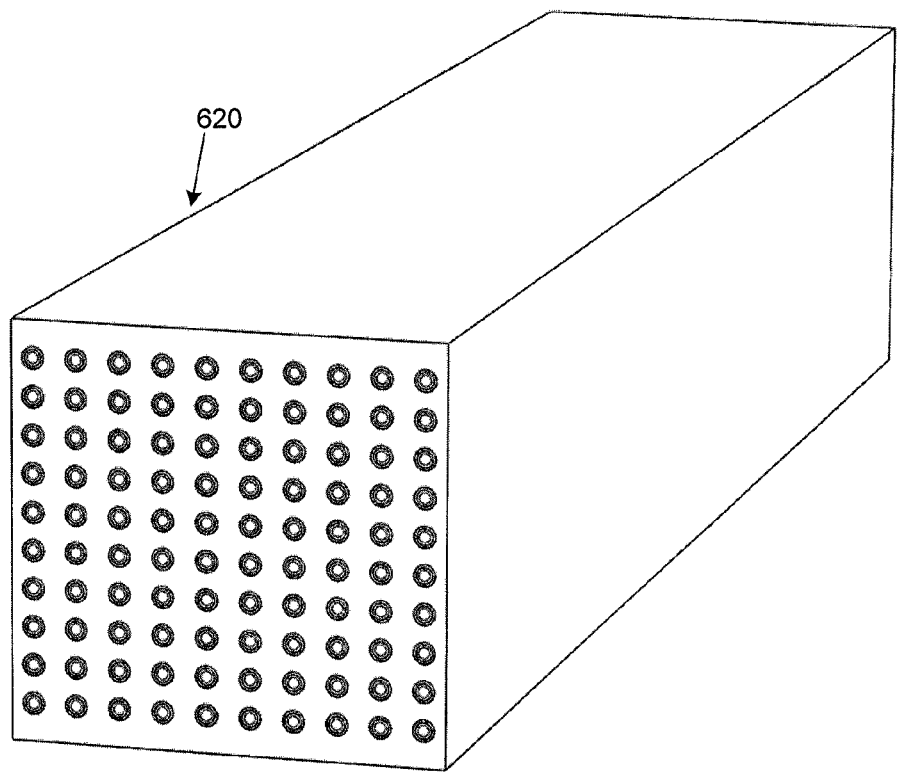
Figure 7D:
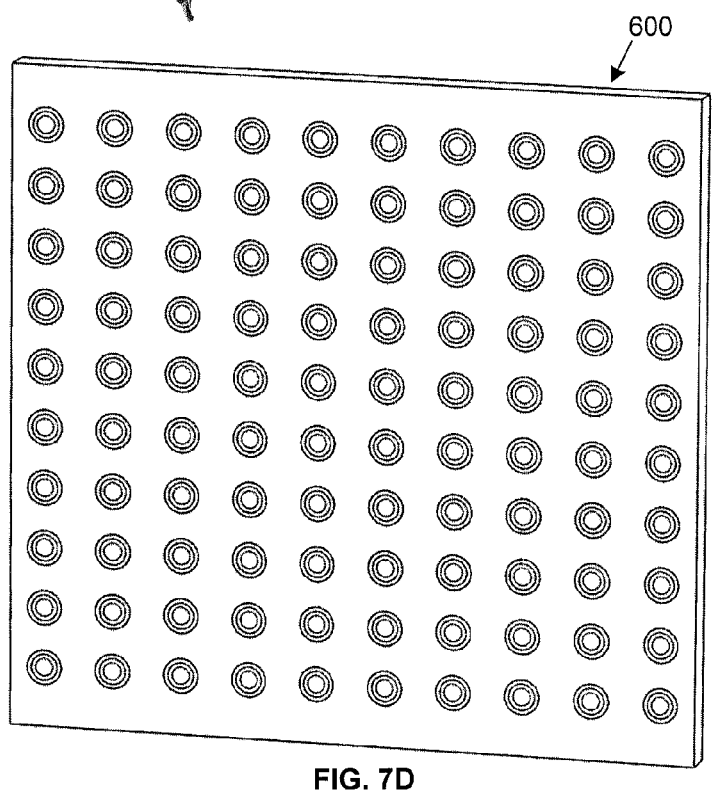

Referring now to FIGS. 7-7D, an alternative method for preparing an interconnection element 600 (FIG. 7D) with encased interconnects 602 is provided. As shown, an insulated conductor 610 is comprised of a conductor 604, surrounded by a dielectric layer 616, which is further surrounded by a metal layer 660. The insulated conductor 610 is therefore similar to the insulated conductor 110 shown in FIG. 1, but has an additional metal layer 660 exposed at an outer surface thereof. As in prior embodiments, the conductor 204 is formed by extruding or drawing metal so that the grains are elongated in the direction of the extrusion. The dielectric layer 216 may be coated on the conductor 204, and a metal layer 660 may be plated onto the exterior surface of the dielectric layer 216 to form the conductor rod 610. This, in effect, provides for a dual metal layer.

A plurality of dielectric rods 630 (FIG. 7A) and insulated conductors 610 may then be arranged in any desired pattern, such as the pattern shown in the stacked arrangement 632 of FIG. 7B. Thereafter, the dielectric rods 630 and dielectric layers 216 of the conductor rods 610 may be treated to form a unitary body 620, as shown in FIG. 7C. The unitary body 620 may then be divided into smaller portions to form an individual interconnection element, such as the interconnection element 600 shown in FIG. 7D.

Figure 8B:
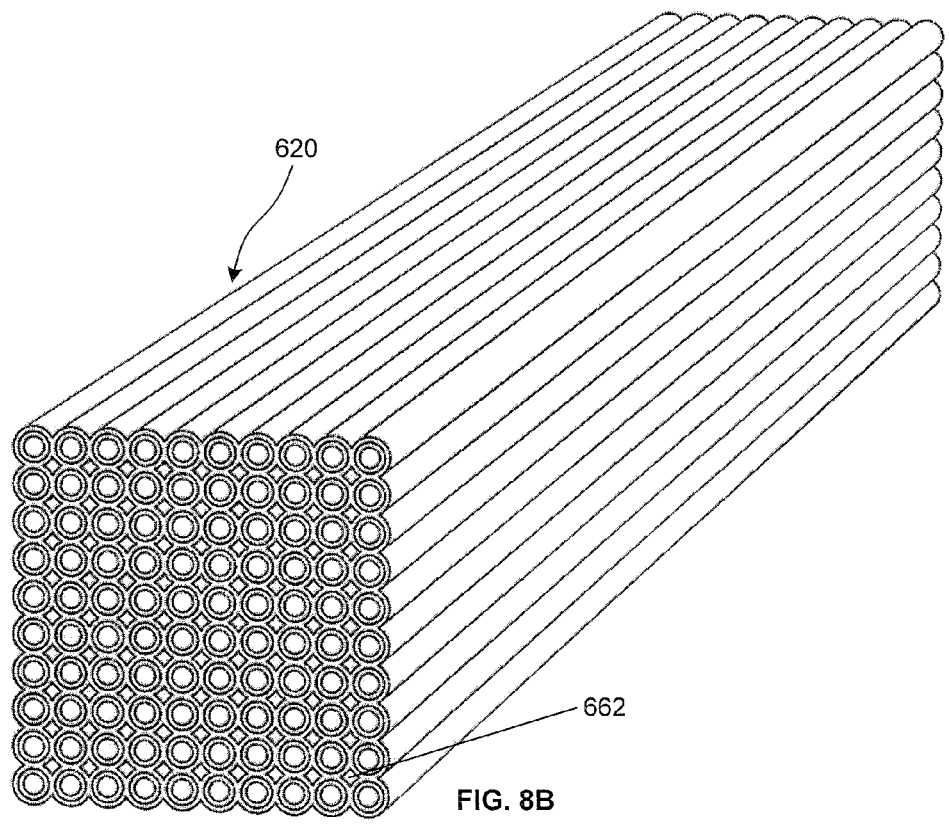
Figure 8C:
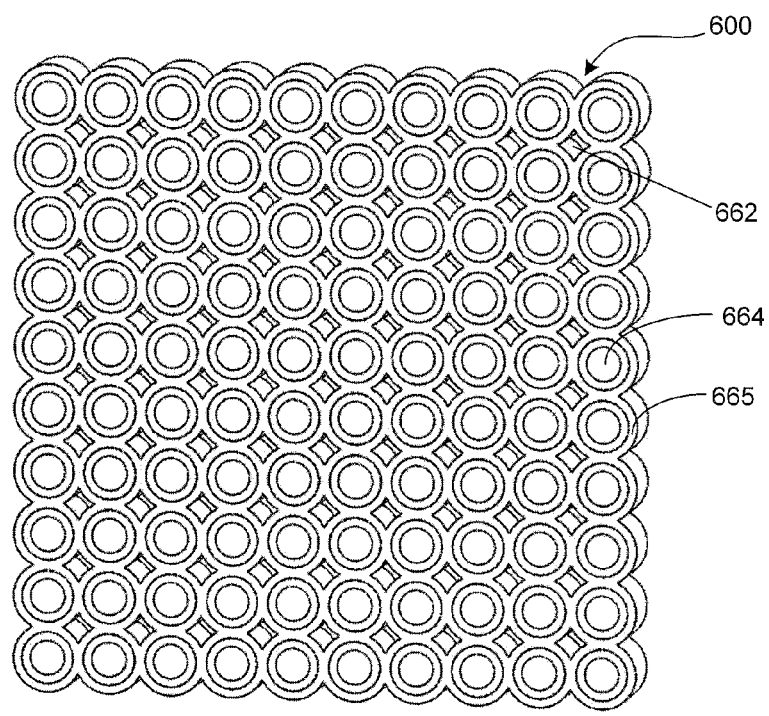

Referring now to FIGS. 8-8C, an alternate arrangement utilizing the insulated conductor 610 shown in FIG. 7 is illustrated. In this embodiment, separate dielectric rods are not incorporated into the stacked arrangement 732. Rather, as shown in FIG. 8A, insulated conductor 610 are arranged in a stacked arrangement. Unlike the previous embodiments, wherein a dielectric rod 630 is placed between adjacent insulated conductors 610, the insulated conductors 610 of this embodiment are stacked directly on one another so that each insulated conductor 610 in each of the horizontal or vertical columns is aligned with one another. As shown in FIG. 8B, upon reflow, the insulated conductors 610 join together to form a unitary body 620, but openings 662 can appear between adjacent conductor rods. The outer metal layers 665 or "clad layers" of the insulated conductors 610 join together to form an electrically continuous reference conductor which can be used for carrying a reference voltage such as ground or a power supply voltage. The inner conductive cores 664 of the insulated conductors 610 can therefore carry respective signals or voltages and can be shielded from one another by the electrically continuous metal layer formed by the clad layers 665. As shown in FIG. 8C, the unitary body 620 can then be cut into individual interconnection elements 600. If desired, a dielectric material can be deposited into the openings 662 between conductor rods 610.

Figure 9:
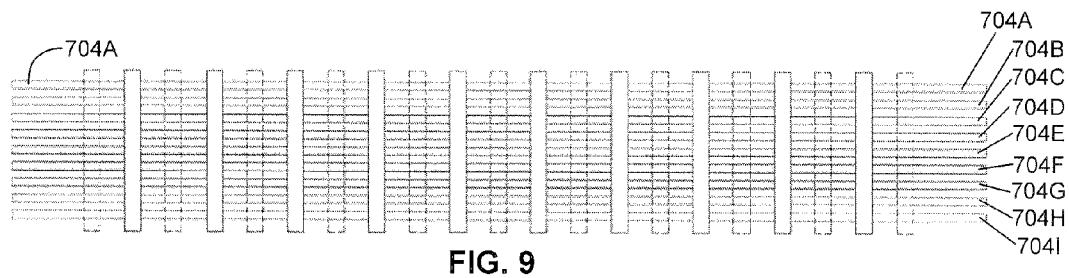
FIGS. 9, 9A, 9B, 9C, 9D, 9E, and 9F illustrate an alternative method of making an alternative interconnection element.
Figure 9A:
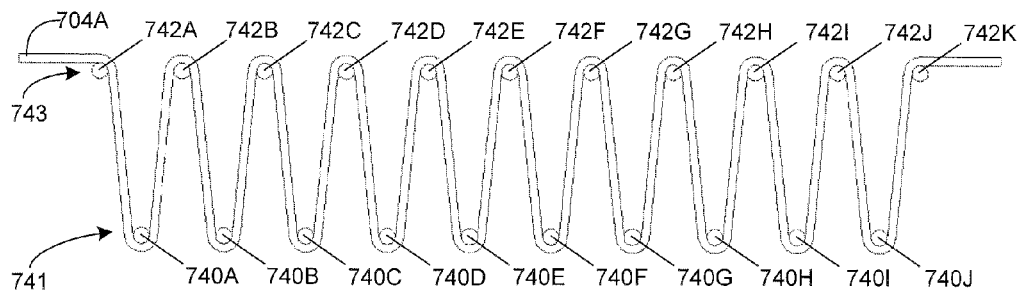
Figure 9B:
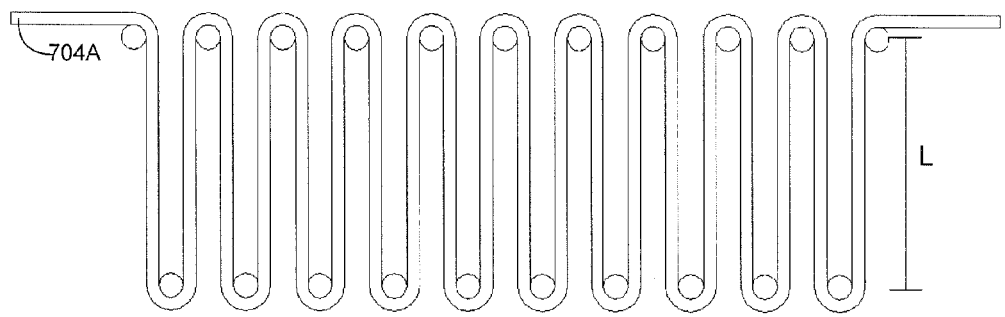
Figure 9C:
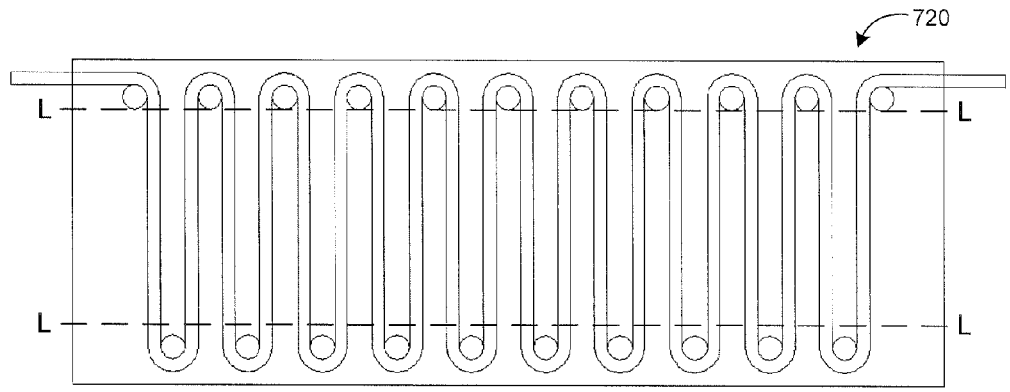
Figure 9D:
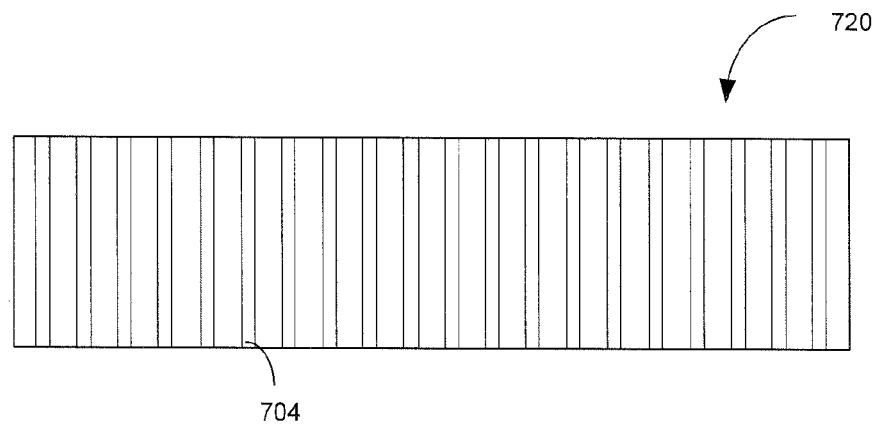
Figure 9E:
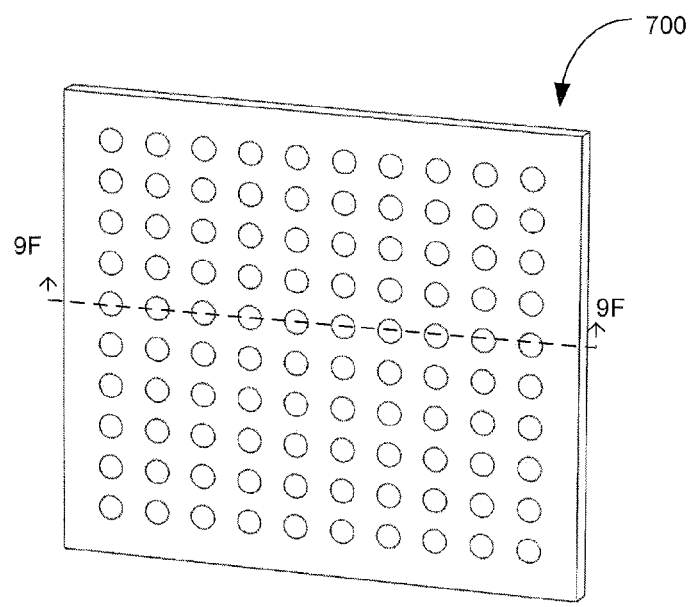
Figure 9F:
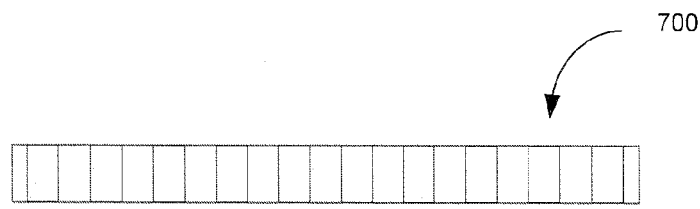

Referring now to FIGS. 9-9F, an alternative method of manufacturing an interconnect element 700 (FIG. 9E) is shown. Instead of merely stacking the drawn or extruded elongated metal conductors or dielectric rods on top of one another into a desired pattern, metal conductors are woven over and under sets of pins and a dielectric material is provided after the metal conductors have been arranged into a desired pattern. Turning first to FIGS. 9-9A, a plurality of pins 740,742 are arranged in two rows, wherein each of the pins 740A-J in the first row 741 is positioned between each of the pins 742A-K in the second row 743.

Referring to FIG. 9A, which is a top plan view of FIG. 9, a first pre-formed metal conductor 704A or metal wire is wrapped over and under each of the pins 740A-J in the first row 741 and pins 742A-K in the second row 743. As best seen in FIG. 9B, the metal conductor follows a serpentine pattern between the first and second rows 741,743. The metal conductor 704A first passes around the first pin 740A in the second row 743, then around the first pin 740A in the first row 741, then around the second pin 742B in the second row 743. The metal conductor 704A continues on in a serpentine path around each of the remaining pins 740B-J in the first and second rows 741,743 until the metal conductor 704 is wrapped around the last pin 740J in the first row 741 and the last pin 742K in the second row 743.

Referring back to FIG. 9, any desired number of metal conductors 704 may be wrapped around each of the pins, so that a plurality of metal conductors 704 are wrapped around the pins 740,742. In one embodiment, metal conductors 704A-I are provided, but any number of metal conductors may be provided as needed. Turning now to FIG. 9B, after each of the desired number of metal conductors 704 are wrapped around the pins 740,742, the pins may be brought closer together. As shown, this allows each of the lengths L of metal conductors between the first and second rows to be aligned with one another, as well as parallel to one another. A dielectric encapsulant 744 can be used to encapsulate the metal conductors 704A-I and pins 740A-J and 742A-K, as shown in FIG. 9C. After the dielectric material is cured, a unitary body 720 is formed, as shown in FIG. 9D. Portions of the unitary body 720 may be cut along planes L-L, which are positioned just inside the planes L-L between the rows of pins 740,742. Once these portions are cut out, the only remaining portions of the unitary body 720 are the metal conductors 704 and the intermediate dielectric material. As in the previous embodiments, the unitary body 720 may be cut into smaller portions to form individual interconnection elements, as shown in FIGS. 9E and 9F. The interconnection element 700 is therefore structurally similar to the previously disclosed embodiments, such as the interconnection element 100 of FIG. 1, but differs in its method of manufacture. Additional conductive elements, conductive layers, and the like may be provided to the interconnection element as needed, including, without limitation, those shown in FIGS. 1B-1F.

Referring now to FIGS. 10-10F, another method for making an alternative interconnection element 800 (FIG. 10D) is shown. In contrast to previous embodiments, this method requires first obtaining a mandrel 746, such as the mandrel 746 shown in perspective view in FIG. 10, and a cross-sectional view in FIG. 10A, and then providing alternating layers of metal conductive wires 754A-D and dielectric wire 753A-D around the top surface 747 and bottom surface 748 of the mandrel 746. The mandrel 746 is primarily used to provide a guide or a base for the overall shape of metal conductive wires and dielectric wires that will be deposited thereon.

Referring now to FIG. 10B, a perspective view, and FIGS. 10B-1 and 10B-2, cross sectional-views of FIG. 10B, are shown. In this embodiment, a continuous dielectric wire 753A is provided across the top surface 747 and bottom surface 748 of the mandrel 746. In one embodiment, the dielectric wire 753A is wrapped around the first end 749 and second end 750 of the mandrel, so that the third and fourth edges 741,752 remain exposed. Due to the wrapping of dielectric wire 753A around the mandrel, the dielectric wire 753A provides for a plurality of rows of the dielectric wire, such as dielectric wire rows 753A1, 753A2, 753A3.

Figure 10C:
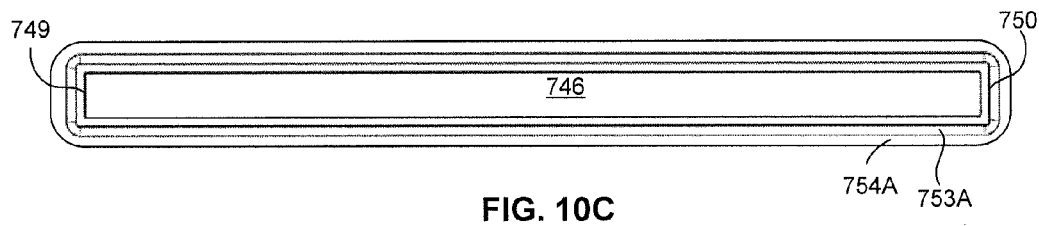

Turning to FIG. 10C, once the first dielectric wire 753A has been wrapped around the mandrel 746, a first wiring layer 754A may be provided. A continuous metal conductor wire 754A may be provided adjacent the first dielectric wire 753A. Referring to FIG. 10C, the metal conductor wire 754A is shown wrapped around first and second edges 749, 750 of the mandrel 746, as well as the dielectric wire 753A.

Figure 10D:
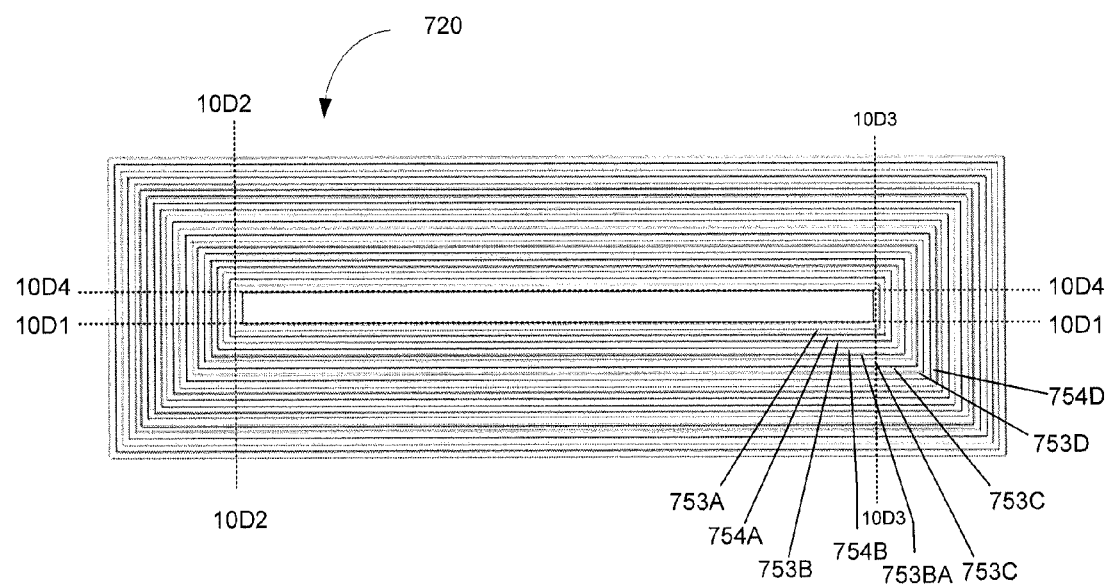

Referring to FIG. 10D, additional alternating layers of dielectric wires, such as 753B, 753C, and 753D, as well as alternating layers of metal conductor wires 754B, 754C, 754D, are shown. Each of the layers extend around the first and second edges 749,750 of the mandrel 746. Once a desired thickness is reached, a unitary body 720 has been formed. The mandrel 746 may then be cut out from the unitary body 720.

Figure 10E:
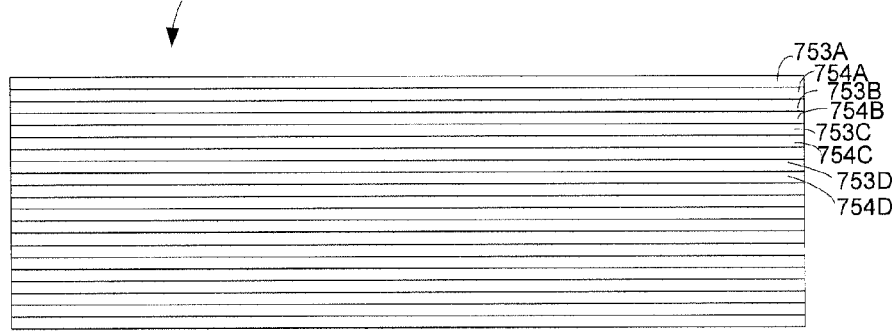
Figure 10F:
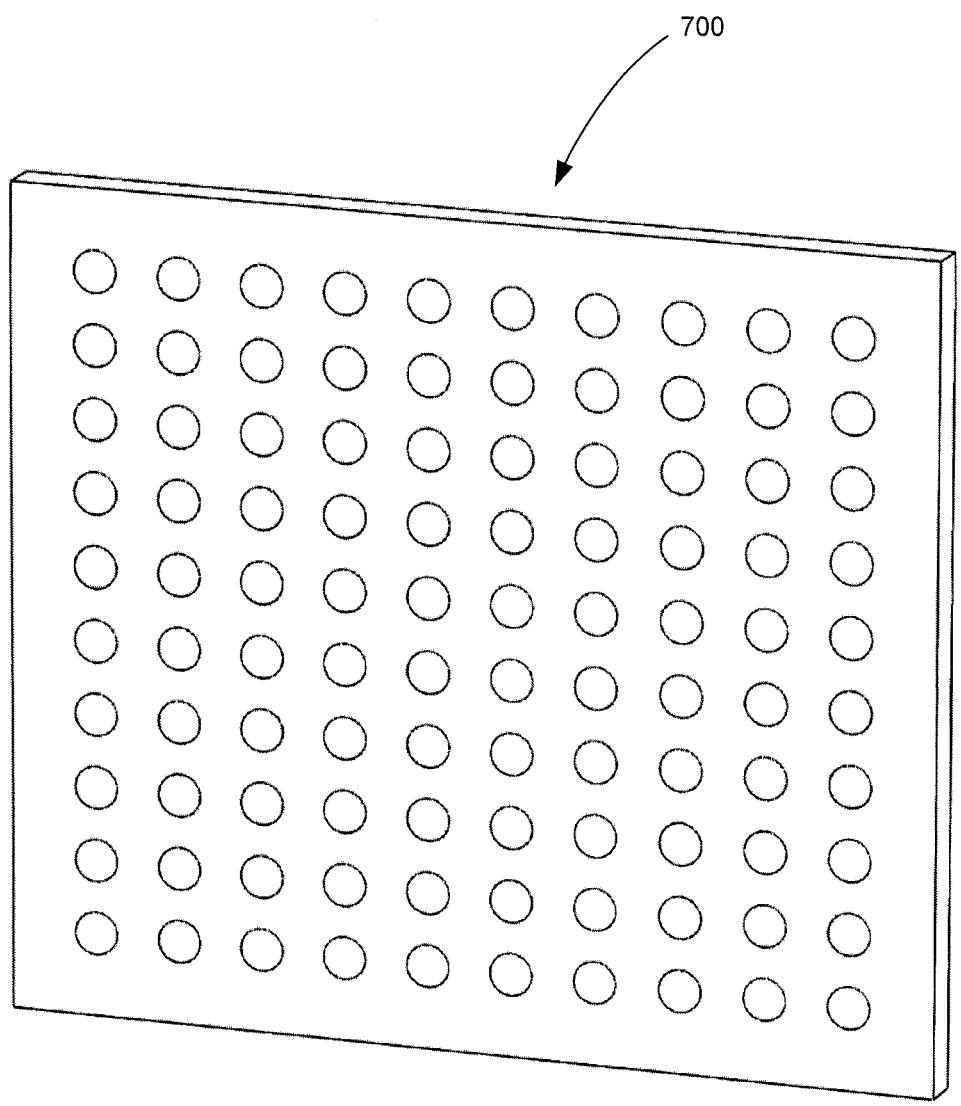

As shown, the unitary body 720 may be cut along lines 10D1-10D1, 10D2-10D2, and 10D3-10D3, which results in the portion 720A of the unitary body 720 shown in FIG. 10E. Additionally, the unitary body 720 may be cut along line 10D4-10D4, which results in a portion 720B (not shown) which is identical to portion 720A. Portions 720A, 720B may then be cut into smaller individual components to form individual interconnection elements, such as the interconnection element 700 shown in FIG. 10E. Additional conductive portions (not shown) may also be provided onto the interconnection element, such as those shown in FIGS. 1B-1G.

Figure 11:
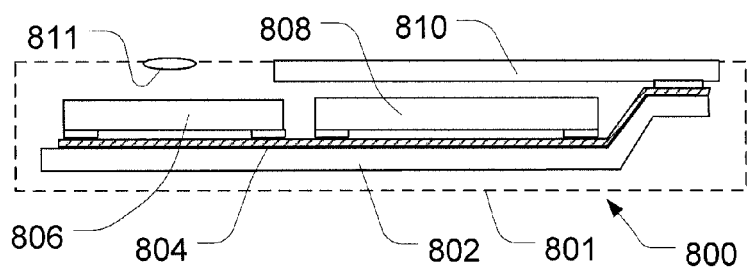
FIG. 11 is a cross-sectional view of a system incorporating an interconnection element.

The various interconnection elements discussed above can be incorporated into microelectronic packages or assemblies that can be used in the construction of diverse electronic systems. In one embodiment, as shown in FIG. 11, a system 800 in accordance with a further embodiment of the invention includes a structure 806 as described in the prior embodiments of microelectronic packages, in conjunction with other electronic components 808 and 810. For example, referring back to FIGS. 1F and 1G, instead of the microelectronic element 174 and interconnection element 100 being electrically connected to a PCB 178, the interconnection element 100 and microelectronic element 174 may be connected to another device to form a system, such as the system 800 shown in FIG. 11. In the example depicted, component 808 is a semiconductor chip whereas component 810 is a display screen, but any other component can be used. Of course, although only two additional components are depicted in FIG. 11 for clarity of illustration, the system may include any number of such components. The structure 806 as described above may be, for example, a composite chip or a structure incorporating plural chips. In a further variant, both may be provided, and any number of such structures may be used. Structure 806 and components 808 and 810 are mounted in a common housing 801, schematically depicted in broken lines, and are electrically interconnected with one another as necessary to form the desired circuit. In the exemplary system shown, the system includes a circuit panel 802 such as a flexible PCB, and the circuit panel includes numerous conductors 804, of which only one is depicted in FIG. 5, interconnecting the components with one another. However, this is merely exemplary; any suitable structure for making electrical connections can be used. The housing 801 is depicted as a portable housing of the type usable, for example, in a cellular telephone or personal digital assistant, and screen 810 is exposed at the surface of the housing. Where structure 806 includes a light-sensitive element such as an imaging chip, a lens 811 or other optical device also may be provided for routing light to the structure. Again, the simplified system shown in FIG. 11 is merely exemplary; other systems, including systems commonly regarded as fixed structures, such as desktop computers, routers and the like, can be made using the structures discussed above.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. An interconnection element, comprising:
a plurality of drawn metal conductors each having a structure in which grains therein have lengths oriented in a direction between first and second ends thereof; and
a dielectric layer surrounding and insulating the conductors, the dielectric layer being comprised of a plurality of treated dielectric rods having outer circumferences directly bonded to each other, the dielectric layer having first and second opposed surfaces and a thickness less than 1 millimeter between the first and second surfaces, wherein the first and second ends of each conductor are not covered by the dielectric layer at the first and second surfaces, at least one of the conductors being configured for carrying a signal to or from a microelectronic element;
the interconnection element having first and second pluralities of wettable contacts adjacent the first and second opposed surfaces, respectively, the first and second wettable contacts being usable to bond the interconnection element to at least one of a microelectronic element and a circuit panel, at least one of the first wettable contacts or the second wettable contacts matching a spatial distribution of element contacts at a face of the microelectronic element and at least one of the first wettable contacts or the second wettable contacts matching a spatial distribution of circuit contacts exposed at a face of a component other than the microelectronic element.

2. The interconnection element of claim 1, wherein a tolerance for a cross-sectional width of the metal conductors is 1 micron for a 50 micron width or diameter.

3. The interconnection element of claim 1, wherein a surface roughness of the metal conductors is less than 1 micron.

4. The interconnection element of claim 1, wherein the metal conductors are comprised of a metal alloy.

5. The interconnection element of claim 1, wherein a thickness of the metal conductors is less than 0.5 millimeters.

6. The interconnection element of claim 1, wherein a thickness of the conductors is less than 100 microns.

7. The interconnection element of claim 1, wherein the conductors have annular shape.

8. The interconnection element of claim 7, wherein each conductor surrounds a dielectric core.

9. The interconnection element of claim 7, wherein the conductors are hollow.

10. The interconnection element of claim 9, wherein air or gas is inside of the conductors.

11. The interconnection element of claim 1, wherein the first wettable contacts define a first pitch and wherein the second wettable contacts define a second pitch that is different from the first pitch.

12. An interconnection element, comprising:
a plurality of drawn metal conductors each having a structure in which grains therein have lengths oriented in a direction between first and second ends thereof;
a common metal region comprised of a plurality of annular components, the plurality of annular components having outer circumferences directly bonded to each other and each of the plurality of annular components surrounding an individual one of the plurality of drawn metal conductors, the common metal region being extruded along an entire length of the plurality of drawn metal conductors, the common metal region forming an outer boundary of the interconnection element and configured to carry a common electric potential; and
a dielectric layer separating the individual ones of the conductors from the common metal region, the dielectric having first and second opposed surfaces and a thickness less than 0.5 millimeters between the first and second surfaces, wherein the first and second ends of each conductor are not covered by the dielectric layer at the first and second surfaces;

wherein the interconnection element has first and second pluralities of wettable contacts adjacent the first and second opposed surfaces, respectively, the first and second wettable contacts being usable to bond the interconnection element to at least one of a microelectronic element and a circuit panel, at least one of the first wettable contacts or the second wettable contacts matching a spatial distribution of element contacts at a face of a microelectronic element or matching a spatial distribution of circuit contacts at a face of a circuit panel.

13. The interconnection element of claim 12, wherein a tolerance for a cross-sectional width of the metal conductors is 1 micron for a 50 micron width or diameter.

14. The interconnection element of claim 12, wherein a surface roughness of the metal conductors is less than 1 micron.

15. The interconnection element of claim 12, wherein the metal conductors are comprised of a metal alloy.

16. The interconnection element of claim 12, wherein a thickness of the metal conductors is less than 0.5 millimeters.

17. The interconnection element of claim 12, wherein a thickness of the conductors is less than 100 microns.

18. The interconnection element of claim 12, wherein the first wettable contacts define a first pitch and wherein the second wettable contacts define a second pitch that is different from the first pitch.

19. A system comprising:
a microelectronic package comprising the interconnection element of claims 1 or 12, and wherein the second wettable contacts are bonded to a microelectronic element; and
one or more other electronic components electrically connected with the package.

20. A system as claimed in claim 19 further comprising a housing, the package and the one or more other electronic components being mounted to the housing.

21. The interconnection element of claim 1, wherein the plurality of drawn metal conductors are substantially comprised of at least one material selected from a group consisting of: gold, copper, copper alloy, and nickel.

22. The interconnection element of claim 12, wherein the plurality of drawn metal conductors are substantially comprised of at least one material selected from a group consisting of: gold, copper, copper alloy, and nickel.

23. The interconnection element of claim 1, wherein the dielectric rods are extruded along a length substantially similar to an entire length of the plurality of drawn metal conductors.

* * * * *